United States Patent
Lak et al.

(10) Patent No.: US 9,647,684 B2
(45) Date of Patent: May 9, 2017

(54) MEMORY-BASED HISTORY SEARCH

(71) Applicant: HUAWEI TECHNOLOGIES CO., LTD., Shenzhen (CN)

(72) Inventors: Zahra Lak, Toronto (CA); Manuel Saldana, Toronto (CA); Barnaby Dalton, Mississauga (CA)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 14 days.

(21) Appl. No.: 14/887,963

(22) Filed: Oct. 20, 2015

(65) Prior Publication Data

US 2016/0110115 A1 Apr. 21, 2016

Related U.S. Application Data

(60) Provisional application No. 62/066,572, filed on Oct. 21, 2014.

(51) Int. Cl.
| | |
|---|---|
| *G06F 12/00* | (2006.01) |
| *H03M 7/42* | (2006.01) |
| *G06F 3/06* | (2006.01) |
| *H03M 7/30* | (2006.01) |

(52) U.S. Cl.
CPC ............ *H03M 7/42* (2013.01); *G06F 3/0608* (2013.01); *G06F 3/0644* (2013.01); *G06F 3/0683* (2013.01); *H03M 7/30* (2013.01); *H03M 7/3084* (2013.01); *H03M 7/3088* (2013.01)

(58) Field of Classification Search
None
See application file for complete search history.

(56) References Cited

U.S. PATENT DOCUMENTS

| | | | |
|---|---|---|---|
| 5,635,932 A | 6/1997 | Shinagawa et al. | |
| 6,195,024 B1 | 2/2001 | Fallon | |
| 6,268,809 B1 | 7/2001 | Saito | |
| 6,563,956 B1 | 5/2003 | Satoh et al. | |
| 6,650,261 B2 | 11/2003 | Nelson et al. | |
| 8,090,027 B2 | 1/2012 | Schneider | |
| 2002/0091905 A1* | 7/2002 | Geiger | H03M 7/30 711/170 |
| 2008/0192523 A1* | 8/2008 | Mondaeev | G11C 15/00 365/49.17 |
| 2008/0301164 A1 | 12/2008 | Isobe | |

(Continued)

FOREIGN PATENT DOCUMENTS

| | | |
|---|---|---|
| CN | 101252694 A | 8/2008 |
| CN | 101572552 A | 11/2009 |

(Continued)

OTHER PUBLICATIONS

United States Patent and Trademark Office, Notice of Allowance dated Mar. 2, 2016, issued in U.S. Appl. No. 14/887,906.

(Continued)

*Primary Examiner* — Baboucarr Faal
(74) *Attorney, Agent, or Firm* — Norton Rose Fulbright Canada LLP; Maya Medeiros

(57) ABSTRACT

Systems, devices and methods for data compression using history search for dictionary based compression. Systems, devices and methods may use parallel processing techniques for data compression and encoding. Systems, devices and methods may provide memory search techniques for hardware.

20 Claims, 11 Drawing Sheets

(56) References Cited

U.S. PATENT DOCUMENTS

| | | |
|---|---|---|
| 2010/0013678 A1 | 1/2010 | Biran et al. |
| 2013/0162453 A1 | 6/2013 | Jaquette |
| 2014/0108362 A1 | 4/2014 | Kim et al. |
| 2014/0198789 A1 | 7/2014 | Kim et al. |
| 2016/0112064 A1* | 4/2016 | Dalton ............... H03M 7/3088 341/106 |

FOREIGN PATENT DOCUMENTS

| | | |
|---|---|---|
| CN | 103078646 A | 5/2013 |
| CN | 103326730 A | 9/2013 |
| TW | 1325233 B | 5/2010 |

OTHER PUBLICATIONS

International Searching Authority, International Search Report and Written Opinion issued Jan. 29, 2016 in International Application No. PCT/CN2015/092447.

International Searching Authority, International Search Report and Written Opinion issued Jan. 7, 2016 in International Application No. PCT/CN2015/092448.

International Searching Authority, International Search Report and Written Opinion issued Jan. 27, 2016 in International Application No. PCT/CN2015/092453.

English Abstract of U.S. Pat. No. 7,164,370(B1) corresponding to TW1325233(B).

English Abstract of CN 103326730A.

English Abstract of CN 103078646A.

English Abstract of CN 101252694A.

English Abstract of CN 101572552A.

Jeremy Fowers, Joo-Young Kim, Doug Burger and Scott Hauck, "A Scalable High-Bandwidth Architecture for Lossless compression on FPGAs", Microsoft Research, University of Washington., Redmond, WA, U.S.A., May 4, 2015.

* cited by examiner

FIG. 10

| POSITION | INPUT TOKENS | BW-1 | BW-2 | BW-4 | BW-8 | CLEAN-1 | CLEAN-2 | FW-1 | FW-2 | FW-4 | FW-8 | LEADERS | SIZES | POSITION |
|---|---|---|---|---|---|---|---|---|---|---|---|---|---|---|
| NORTH BY NORTHWEST | | | | | | | | | | | | | | |
| 0 | "N":1 | "N":1 | "N":1 | "N":1 | "N":1 | "N":1 | "N":1 | "N":2 | "N":4 | "N":8 | "N":9 | YES | 2 | 0 |
| 1 | "o":1 | "o":1 | "o":1 | "o":1 | "o":1 | "o":1 | "o":1 | "o":2 | "o":4 | "o":8 | "o":8 | NO | 1 | 2 |
| 2 | "r":1 | "r":1 | "r":1 | "r":1 | "r":1 | "r":1 | "r":1 | "r":2 | "r":4 | "r":7 | "r":7 | NO | 1 | 3 |
| 3 | "t":1 | "t":1 | "t":1 | "t":1 | "t":1 | "t":1 | "t":1 | "t":2 | "t":4 | "t":6 | "t":6 | NO | 1 | 4 |
| 4 | "h":1 | "h":1 | "h":1 | "h":1 | "h":1 | "h":1 | "h":1 | "h":2 | "h":4 | "h":5 | "h":5 | NO | 1 | 5 |
| 5 | " ":1 | " ":1 | " ":1 | " ":1 | " ":1 | " ":1 | " ":1 | " ":2 | " ":4 | " ":4 | " ":4 | NO | 1 | 6 |
| 6 | "b":1 | "b":1 | "b":1 | "b":1 | "b":1 | "b":1 | "b":1 | "b":2 | "b":3 | "b":3 | "b":3 | NO | 1 | 7 |
| 7 | "y":1 | "y":1 | "y":1 | "y":1 | "y":1 | "y":1 | "y":1 | "y":2 | "y":2 | "y":2 | "y":2 | NO | 1 | 8 |
| 8 | " ":1 | " ":1 | " ":1 | " ":1 | " ":1 | " ":1 | " ":1 | " ":1 | " ":1 | " ":1 | " ":1 | NO | 1 | 9 |
| 9 | COPY (-9,4) | COPY (-9,4) | COPY (-9,3) | COPY (-9,4) | COPY (-9,4) | COPY (-9,4) | COPY (-9,4) | COPY (-9,4) | COPY (-9,5) | COPY (-9,5) | COPY (-9,5) | YES | 2 | 10 |
| 10 | COPY (-9,4) | COPY (-9,3) | COPY (-9,3) | COPY (-9,3) | COPY (-9,3) | COPY (-9,3) | COPY (-9,3) | COPY (-9,4) | COPY (-9,4) | COPY (-9,4) | COPY (-9,4) | NO | 0 | 12 |
| 11 | "r":1 | "r":1 | COPY (-9,3) | COPY (-9,3) | COPY (-9,3) | COPY (-9,3) | COPY (-9,3) | COPY (-9,3) | COPY (-9,3) | COPY (-9,3) | COPY (-9,3) | NO | 0 | 12 |
| 12 | "t":1 | "t":1 | COPY (-9,2) | COPY (-9,2) | COPY (-9,2) | COPY (-9,2) | COPY (-9,2) | COPY (-9,2) | COPY (-9,2) | COPY (-9,2) | COPY (-9,2) | NO | 0 | 12 |
| 13 | "h":1 | "h":1 | COPY (-9,1) | COPY (-9,1) | COPY (-9,1) | COPY (-9,1) | COPY (-9,1) | COPY (-9,1) | COPY (-9,1) | COPY (-9,1) | COPY (-9,1) | NO | 0 | 12 |
| 14 | "w":1 | "w":1 | "w":1 | "w":1 | "w":1 | "w":1 | "w":1 | "w":2 | "w":4 | "w":4 | "w":4 | YES | 2 | 12 |
| 15 | "e":1 | "e":1 | "e":1 | "e":1 | "e":1 | "e":1 | "e":1 | "e":2 | "e":3 | "e":3 | "e":3 | NO | 1 | 14 |
| 16 | "s":1 | "s":1 | "s":1 | "s":1 | "s":1 | "s":1 | "s":1 | "s":2 | "s":2 | "s":2 | "s":2 | NO | 1 | 15 |
| 17 | "t":1 | "t":1 | "t":1 | "t":1 | "t":1 | "t":1 | "t":1 | "t":1 | "t":1 | "t":1 | "t":1 | NO | 1 | 16 |

FIG. 11

MEMORY-BASED HISTORY SEARCH

CROSS REFERENCE TO RELATED APPLICATION

This application claims the benefit of and priority to U.S. Provisional Patent Application No. 62/066,572 entitled Systems, Devices and Methods for Data Compression filed Oct. 21, 2014, the entire contents of which is hereby incorporated by reference.

FIELD

Embodiments described herein relate generally to systems, devices and methods for data compression, and in particular, to systems, devices and methods for lossless data compression.

BACKGROUND

Data compression involves processing a sequence of symbols as input, and attempting to produce a shorter sequence as output. Lossless data compression attempts to reduce output without losing information by identifying and eliminating statistical redundancy within the input data.

DESCRIPTION OF THE FIGURES

FIGS. 10 and 11 are tables illustrating the encoding process according to some embodiments.

Figure 1:
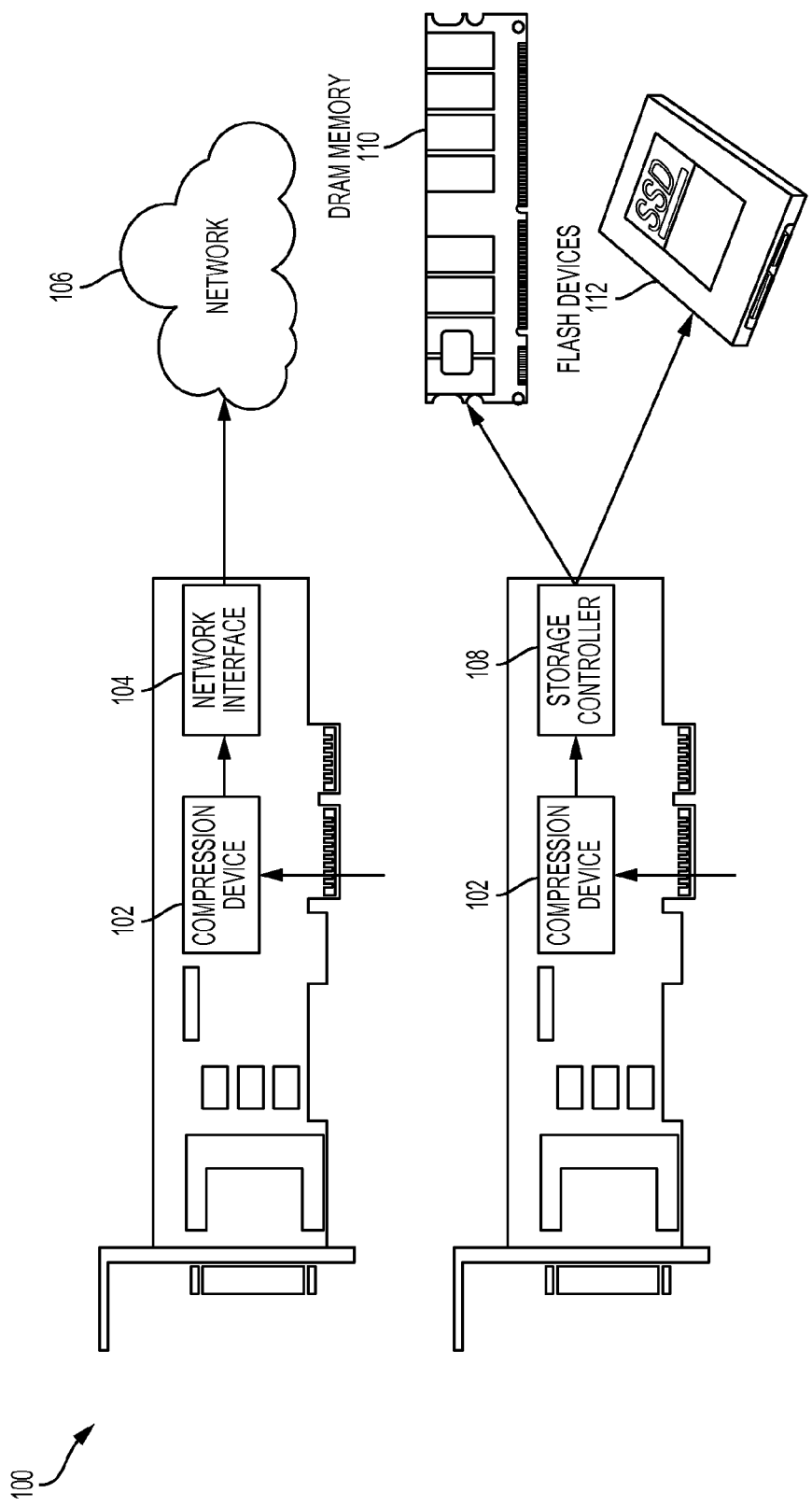
FIG. 1 is a schematic view of an example of a system for data compression according to some embodiments.

These drawings depict exemplary embodiments for illustrative purposes, and variations, alternative configurations, alternative components and modifications may be made to these exemplary embodiments.

SUMMARY

In an aspect, there is provided a circuit for history matching a data stream being sequentially introduced to the circuit. The circuit involves a first memory including N storage locations, the first memory configured to store a currently introduced sequence of symbols such that the N most recently introduced words are stored in the first memory and an array of M second memories, each second memory including N storage locations, the array defining a set of storage locations logically divided into N rows of M storage locations, each row including one storage location from each of the M second memories, the array of M second memories configured to store the currently introduced word at a select storage location of the set of storage locations. The circuit has a plurality of comparators configured for comparing data from all of the storage locations in the first memory with data stored in a select row of the set of storage locations, where outputs of the comparators provide history matching data and a memory selector for identifying the select storage location, the memory selector configured to identify a next storage location in a storage location sequence with the introduction of each word, where the storage location sequence cycles through the set of storage locations such that M consecutively introduced words are each stored in a different second memory in the array. The circuit has a row selector for identifying the select row, the row selector configured to identify a next select row with the introduction of each word, the select row cycling through each of the N rows for every N introduced words.

In some embodiments, the plurality of comparators are configured to compare overlapping data windows of the data in the first memory and the data in the select row.

In some embodiments, each of the second memories are dual port memories or two port memories.

In some embodiments, the circuit is implemented on a field-programmable gate array (FPGA) or an application specific integrated circuit (ASIC).

In some embodiments, the second memories are block random access memories.

In some embodiments, the circuit has a storage device for storing the outputs of the comparators.

In some embodiments, the first memory is a shift register or a circular buffer.

In some embodiments, the circuit is a synchronous circuit configured to introduce a new word every clock cycle.

In some embodiments, an introduced word is compared against an N×M word history after N clock cycles.

In some embodiments, the data windows are based on an input bus width or circuit resource availability.

In another aspect, there is provided a method for history matching a data stream. The method involves sequentially introducing each word in the data stream. Introducing a current word in the input sequence may includes storing the current word in a storage location of a first memory having N storage locations such that the N most recently introduced words are stored in the first memory, storing the current word in an array of M second memories, each second memory including N word storage locations, the array defining a set of storage locations logically divided into N rows of M storage locations, each row including one storage location from each of the M second memories, wherein the current word is stored according to a storage location sequence which cycles through the set of storage locations such that M consecutively introduced words are each stored in a different second memory in the array, and concurrently comparing data stored in the N storage locations of the first memory with data stored in a select row of the set of storage locations. The method may involve storing outputs of the comparisons as history match results, where the select row changes with the introduction of each word, the select row cycling through each of the N rows for every N introduced words.

In some embodiments, comparing the data stored in the N storage locations of the first memory with the data stored in the select row comprises comparing overlapping data windows of the data in the N storage locations of the first memory and the data stored in the select row.

In some embodiments, each of the second memories are dual port memories or two port memories.

In some embodiments, the method is performed on a field-programmable gate array (FPGA) or an application specific integrated circuit (ASIC).

In some embodiments, the second memories are block random access memories.

In some embodiments, storing the outputs of the comparisons comprises collating the history match results.

In some embodiments, providing the history match results to an encoder.

In some embodiments, an introduced word is compared against an N×M word history after N clock cycles. In some embodiments, the data windows are based on an input bus width or circuit resource availability.

In another aspect, there is provided a device for history matching a data stream, each word of the data stream being sequentially introduced. The device has a first memory including N storage locations, the first memory configured to store a currently introduced word such that the N most recently introduced words are stored in the first memory, and an array of M second memories, each second memory including N storage locations, the array defining a set of storage locations logically divided into N rows of M storage locations, each row including one storage location from each of the M second memories, the array of M second memories configured to store the currently introduced word at a select storage location of the set of storage locations. The device has a plurality of comparators configured for comparing data from all of the storage locations in the first memory with data stored in a select row of the set of storage locations, where outputs of the comparators provide history matching data. The device also has a memory selector for identifying the select storage location, the memory selector configured to identify a next storage location in a storage location sequence with the introduction of each word, where the storage location sequence cycles through the set of storage locations such that M consecutively introduced words are each stored in a different second memory in the array. The device has a row selector for identifying the select row, the row selector configured to identify a next select row with the introduction of each word, the select row cycling through each of the N rows for every N introduced words.

DETAILED DESCRIPTION

Data compression involves receiving a sequence of symbols as input, and attempting to produce a shorter sequence as output. Lossless data compression attempts to reduce output without losing information by identifying and eliminating statistical redundancy within the input data. Lossless data compression produces the original input stream upon decompression. Lossy compression produces a similar but possibly non-identical stream.

Dictionary based compression systems may be configured to find repeated substrings in the input and encode subsequent occurrences of those substrings as pointers to earlier occurrences.

At each location in the input stream, a compression system may be configured to consider various factors, such as for example, another sequence of characters, the longest sequence that has occurred previously, the most recent occurrence, and so on. Different factors may determine how well a compression system, device, or method functions. Compression systems may be evaluated using various metrics, including, for example, compression ratio, compression/decompression speed, splittability, required memory and other resources during compression/decompression, the ability to perform work in parallel and so on. Compression speed may be proportional to compression ratio. Some example systems may have a high compression speed and a low compression ratio, while other systems may have a relatively low compression speed and a relatively high compression ratio, for example.

Compression speed may be an important consideration. A fast compression system operating at full stream throughput may generate a relatively small compression ratio. This may nevertheless help reduce data output. For example, a compression device may be situated between a host device and a network interface controller device, or storage controller device.

In accordance with another aspect, there is provided a compression device that implements a parallel history search using sorting techniques. The parallel processing may enhance compression speed.

In accordance with another aspect, there is provided a compression device having a receiver to receive uncompressed input data. The input data may be represented as a sequence of symbols. The compression device may include a processor configured to implement dictionary based history search on the sequence of symbols of the input data to generate an intermediate data structure of tags or tokens for encoding into a compressed output stream. The compression device may further include an encoder configured to encode the sequence of symbols of the input data for the compressed output stream. An output generator may generate tokens as compressed output data using the encoded sequence of symbols of the input data. The compression device may include a transmitter configured to transmit the compressed output data, or a storage device configured to store the compressed output data.

In accordance with another aspect, there is provided a method for data compression. The method may involve processing input data represented as a sequence of symbols to generate output data. At each location, the method may create a tag with a string of one or more symbols and a location. The method may further involve sorting the tags by prefix to generate a sorted sequence of tags. For each tag in the sorted sequence of tags, the method may further involve comparing the tag with neighbouring or adjacent tags. If there is a tag with a common prefix at a defined number of symbols that has an earlier or other source then the compression device creates a copy token, otherwise the compression device creates a literal token. The method may involve ordering the tokens by the corresponding location or by prefix.

In accordance with an aspect, there is provided a compression device with parallel processing to implement a history search using sorting. The device may be implemented using a graphics processing unit (GPU) or a highly parallel central processing unit (CPU), for example.

In accordance with another aspect, there is provided a compression device having an encoder to encode in parallel to generate compressed output data. The encoder may operate on various types of input data resulting from a history search, for example, to encode the compressed output data.

In accordance with another aspect, there is provided a compression device with registers, a field programmable gate array (FPGA) configured to process uncompressed input data using search history, and block random access memory for storing results of the search history. Embodiments described herein may provide a process for implementing parallel history search on FPGAs.

In accordance with another aspect, there is provided a compression device having a processor configured to implement history search for dictionary-based compression, and a systolic dictionary-based compression encoder.

In accordance with another aspect, there is provided a method for encoding for dictionary based compression with parallel processors. The method may involve receiving uncompressed input data. The method may involve processing input data using a backward pass. The method may involve processing the input data using a cleanup pass. The method may involve processing input data using a forward pass. The method may involve processing input data using a leader pass. The method may involve processing input data using a placement pass. The method may involve generating compressed input data using results of the backward pass, cleanup pass, forward pass, leader pass, and placement pass.

Illustrative examples are provided to show various aspects of the embodiments described herein.

FIG. 1 illustrates a schematic view of an example compression system 100. Embodiments described herein may provide hardware compression devices 102 for transparent in-path compression and decompression, which may also be referred to herein as compression engine devices. As an illustrative example implementation, a compression device 102 may couple to network interface controller device 104 for data transmission over a network 106. As another illustrative example implementation, a compression device 102 may couple to a storage controller device 108 for data storage on a storage medium, e.g. flash device 112 or DRAM memory card 110. The result of methods described herein may be a tangible, physical medium of the compressed output data.

History Search

In accordance with an aspect, embodiments described herein may provide dictionary-based compression, such as a vector based history search for dictionary-based compression.

To maximize compression, an example compression system may be configured to detect and determine the longest matching sequence. One example system may be implemented by central processing units (CPU) using persistent data structures called trees. These data structures may be defined as binary search trees that record the location of every prefix observed.

Alternatively, another example compression system may keep track of the most recent occurrence of a string of symbols that matches for different numbers of characters, as stored in tag data structures. As an illustrative example, the number characters stored in the tag may range from four to seven. If there are too few characters in the tag then the processed string may not be that compressed given the memory usage of the tags and encoding. If there are too many characters in each tag then the sorting may increase and, as a result, the tag size may increase memory use.

As an illustrative example, four characters per tag may be the shortest tag that does not cause expansion. Encoding a tag that copies four characters may be guaranteed not to take up more space than resending those four characters as literals. Different encoding schemes may have different cut-off points for the number of tags and this is an example only. Longer tags may introduce considerable complexity when comparing neighbouring or adjacent tags post-sort. Longer tags may also increase the compression ratio because they can distinguish between a copy that will be five symbols or characters long from one that is only four symbols. Accordingly, there may be trade-off between compression complexity and compression ratio.

The system may provide a lower compression ratio (e.g. uncompressed size compared to compressed size) as it may not find an optimal match for the copy references but may provide faster compression speed or throughput. An example system may utilize a hash table that is updated at each location in turn. Systems may be sequential and data dependent, and may have software configurations.

Embodiments described herein may operate using parallel processing hardware to expose benefits of parallelism. Embodiments describe herein may use a modified history search to identify the most recent search that employs data parallelism using sorting. Accordingly, the example system 100 may be implemented using parallel processing hardware.

In accordance with an aspect, embodiments described herein may provide dictionary-based compression, such as a vector based history search for dictionary-based compression. The hardware compression device may configure various compression implementations designed for throughput over compression. The history search may be the bottleneck in dictionary-based compression and techniques may create strong linear dependence chains that may be difficult or impossible to extract parallelism for.

Accordingly, embodiments described herein may involve history search implemented via sorting. The sorting may be implemented using data-parallel processing, which may be parallelized using a large number of threads.

Figure 2:
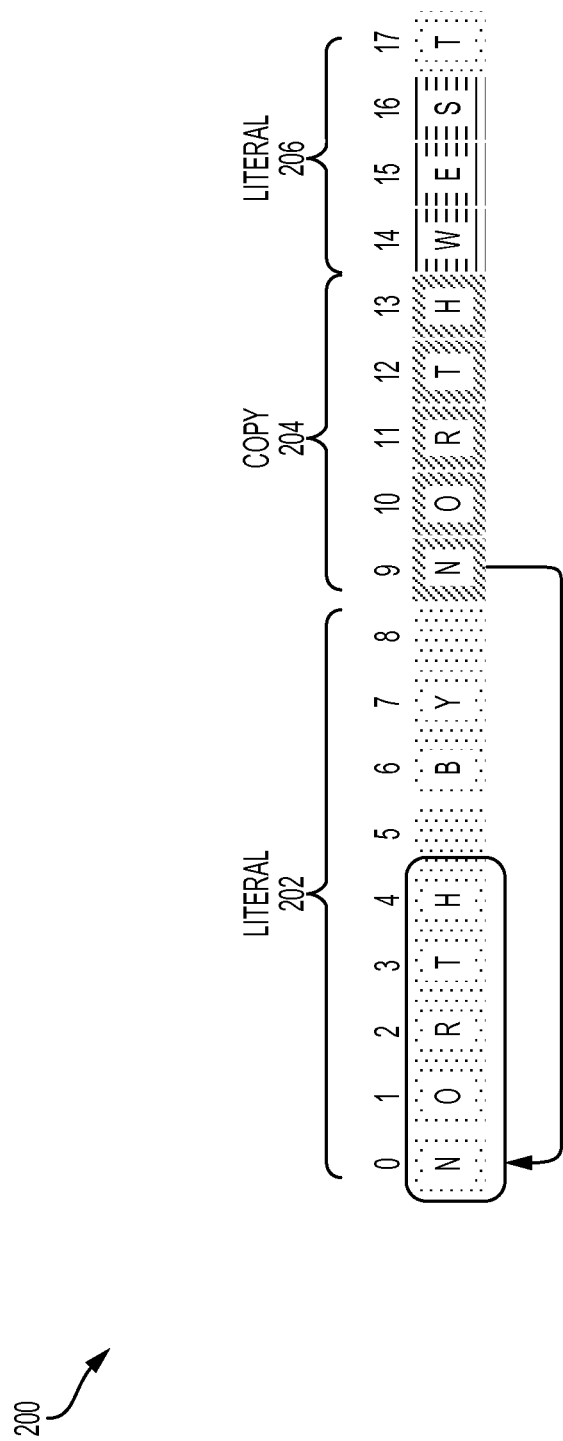
FIG. 2 is a schematic view of illustrative example input for compression processing.

FIG. 2 illustrates example input for compression processing. Example input may be a sequence of input symbols of uniform size, typically 8 bit bytes. Example output may be a sequence of tokens of the same length as the input. A token may be either a literal (e.g. characters or symbols), or a copy instruction. A copy instruction may include the location within the sequence the copy of the characters or symbols comes from, and the number of symbols being copied. The example shown in FIG. 2 illustrates a copy reference pointer for symbols 9 to 13 to the earlier instance of the sequence of symbols 0 to 4. This may be referred to as backward copies.

Figure 3:
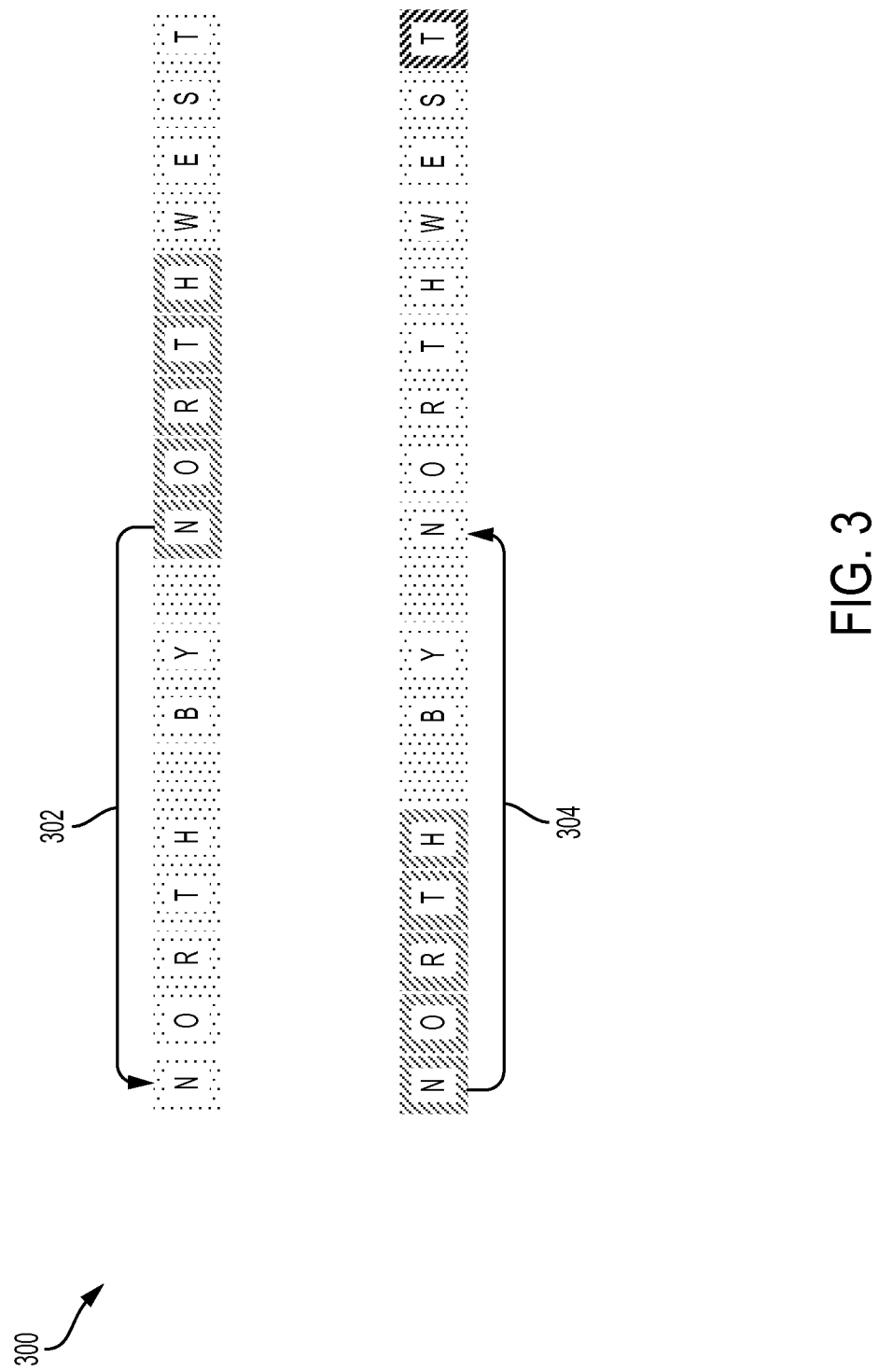
FIG. 3 is an alternate schematic view of illustrative example input for compression processing.

FIG. 3 illustrates an alternative implementation with a copy reference pointer to a later instance of the sequence at symbols, which may be referred to as forward copies.

The compression device 102 (FIG. 1) may have circuit for history searching an input data stream to generate a history search output stream. The circuit may have an input unit to receive an incoming input data stream of a sequence of symbols. A memory device stores the sequence of symbols of the input data stream at storage locations. This may be referred to as a history buffer. The storage locations may be linked to positions with the sequence of symbols.

The circuit has a parallel processor to implement a dictionary based history search on the input data stream in the memory device using a parallel sort to generate the history search output data stream of tokens. Each token defines a type, the type being a literal token or a copy token. Each literal token defining a literal symbol of the sequence of symbols of the input data stream. Each copy token having a copy reference pointer identifying a position of one or more copied symbols in the sequence of symbols of the input data stream. The position corresponds to a storage location of the storage locations of the memory device storing the input data stream. The copied symbols may have corresponding one or more literal symbols of the literal tokens of the history search output data stream. That is, the copy tokens may refer to a position or offset in the input data stream to refer to a copy of the literal symbols at that position or offset. The copy token may also indicate how many symbols to copy. Accordingly, a copy token may define a length of symbols and an offset value for the copy reference pointer.

A comparator compares the sequence of symbols from the storage locations in the memory to identify the one or more copied symbols and the corresponding one or more literal symbols for the parallel sort. A memory selector to select, for each copy reference pointer, the storage location corresponding to the position identified by the respective copy reference pointer. Example comparators and selectors are described herein. An output unit connects to a recipient device to output the history search output stream for compression of the input data stream.

The parallel processor continuously generates tags representing the input data stream, each tag defining a window of k consecutive symbols in the sequence of symbols, k being an integer, and a tag position in the sequence of symbols of the input data stream. The tag position refers to a first symbol of the k consecutive symbols in the window. The tag position for a corresponding storage location of a first symbol of the window of k symbols in the memory device.

The parallel processor, for the parallel sort, sorts the tags based on the windows of k symbols. The sort may be based on a lexicographic or alphanumeric order of the windows of k symbols of the tags, depending on the type of symbols of the input data stream.

A first tag and second tag may have two consecutive tag positions, and a portion of the k symbols of the window of the first tag overlaps another portion of the k symbols of the window of the second tag with k−1 overlapping symbols.

The comparator may compare each tag to a predetermined number of neighbouring or adjacent tags to identify redundant tags, for each redundant tag, the window of k symbols being equal to the window of k symbols of another tag. In some examples k ranges between four to seven to provide an efficient compression.

A redundant tag may refer to previous occurrences of the same symbols in the input data stream. Given Tags A and B, Tag A may be redundant to Tag B if: the first j symbols of both tags are identical; 4<=j<=k, or the position of tag A is >the position of tag B. This is an example for back-references. This may result in the circuit creating a Copy (delta=B.position−A.position, length=j) token. If A is not redundant to B, then the circuit may create a Lit (content=first symbol, length=1) token.

For each redundant tag, the parallel processor, generates a copy token of the copy tokens for the history search output data stream, and the memory selector selects the storage location corresponding to the tag position of the other tag for the copy reference pointer for the copy token for the redundant tag.

The parallel processor orders the tags, including the redundant tags, by the tag positions to generate the output data stream of the literal tokens and the copy tokens, the copy tokens corresponding to the redundant tags at the tag positions in output data stream.

The circuit may be implemented on graphic processing unit or a parallel central processing unit. The circuit may couple to an encoder and an output generator. The encoder may transform the history search output data stream into a compressed output stream by coalescing a portion of the copy tokens and a portion of the literal tokens of the history search output data stream, the compressed output data stream being compressed relative to the input data stream. The output generator may be configured to output the compressed output data stream. The encoder coalesces the portion of the copy tokens by the encoder coalescing consecutive overlapping copy tokens into longer copy tokens. The encoder coalesces the portion of the literal tokens by combining individual literal tokens into combined literal tokens of larger size. The encoder coalesces the portion of the copy tokens by, for each copy token, determining a length n of the copied literal symbols, n being an integer, and removing n−1 subsequent literal tokens as defined by the sequence of symbols of the input data stream. In some examples, the encoder is a systolic dictionary-based compression encoder with parallel scan for a backward pass, a cleanup pass, a forward pass, leader pass, and placement pass to generate the output data stream. Further details of the encoding process are described herein.

As shown in FIG. 1, a compression system with the compression device having the circuit may also include a network interface 104 for transmitting the compressed output stream. The compression system with the compression device having the circuit may also include a storage controller 108 for storing the compressed output stream on a physical non-transitory computer readable medium.

Figure 4:
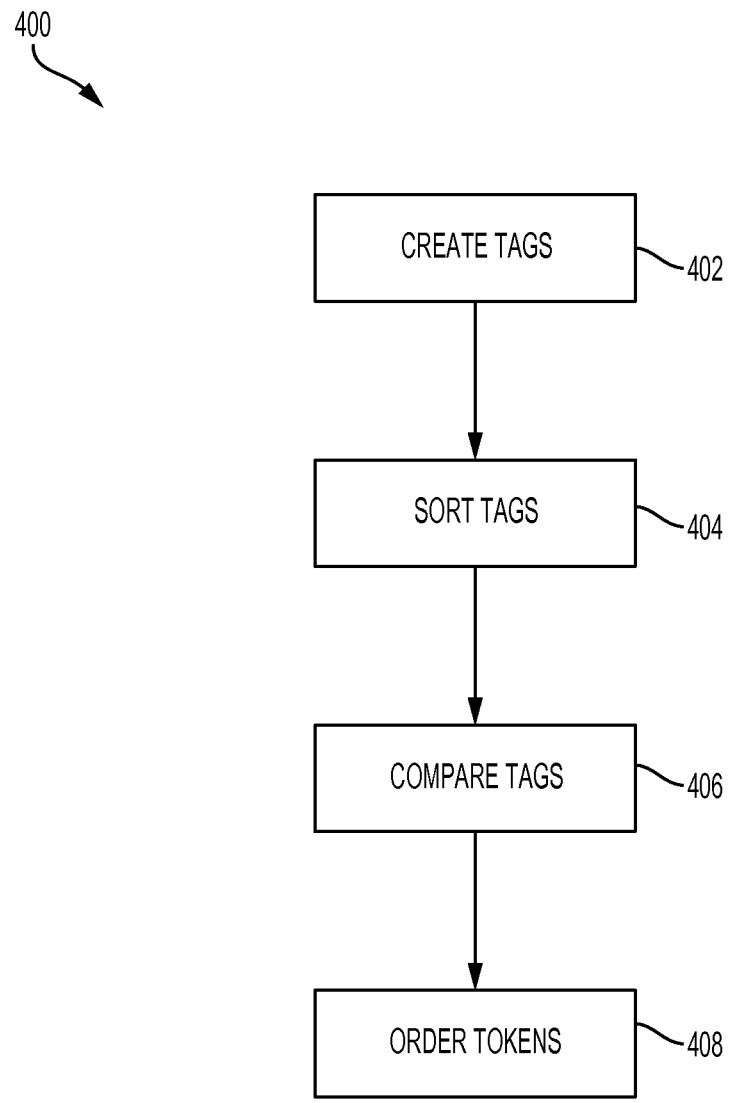
FIG. 4 is a flowchart view of an example method for data compression according to some embodiments.

FIG. 4 illustrates a flowchart view of a method 400 for a parallel history search to compress data in accordance with an aspect of embodiments described herein. The method 400 may be implemented by a circuit or particular hardware device, such as for example a GPU, a parallel CPU, FPGA or other parallel processing device. The method may be implemented by a hardware compression device, or by a compression system in various embodiments.

The method 400 may involve receiving an incoming input data stream, the input data stream comprising a sequence of symbols. The method 400 may involve storing on a memory device the sequence of symbols of the input data stream at storage locations. As will be described, the method 400 involves parallel processing the input data stream in the memory device using a parallel sort to generate a history search output data stream of tokens, each token defining a type, the type being either a literal token or a copy token. Each literal token defines a literal symbol of the sequence of symbols of the input data stream and each copy token has a copy reference pointer identifying a position of one or more copied symbols in the sequence of symbols of the input data stream. The position corresponds to a storage location of the storage locations of the memory device storing the input data stream. The one or more copied symbols having corresponding one or more literal symbols of the literal tokens of the history search output data stream.

At step 402, a hardware compression device may, at each location, create tags to represent the input data stream. This tagging operation may be viewed as a k character or symbol sliding window, where k is an integer. For example, k may be four characters. That is, the hardware compression device may continuously generate tags representing the input data stream, each tag defining a window of k consecutive symbols in the sequence of symbols, k being an integer, and a tag position in the sequence of symbols of the input data stream. The tag position may refer to a first symbol of the k consecutive symbols in the window, the tag position for a corresponding storage location of a first symbol of the window of k symbols in the memory device.

Compression may involve taking a hash of the character window and storing the hash into a table for reference. The same four characters will give the same entry into the table so that when the device detects the same hash in the table, the device performs a copy operation. This is generally a sequential process implemented using CPUs. However, parallel processing hardware may improve compression speed. The circuit may use a comparator to compare the character window to other windows of characters stored in the memory to find a match. Embodiments described herein may implement a parallel history search using parallel processing hardware. A sequential history search may involve data dependency because earlier sequences of symbols are searched to find copy references. The embodiments described herein implement a parallel history search using tags and sorting operations.

For example, the tag operation may process the input data stream to creates tags, where each tag stores a string of k symbols and the location. Referring to FIG. 2 as an illustrative example, if k=4, then the first tag would be ("nort" @ 0) and the second would be ("orth" @ 1).

At step 404, the compression device may sort the tags by prefixes, breaking ties with location. For letter symbols the sort may be alphabetical. Different sort orders may be defined for different characters and symbols. The compression device will sort the tags to identify redundant data in neighbouring or adjacent tags, and replace redundant literal symbols or characters with copy reference pointers in order to generate compressed output. For example, the sort may result in ("nort" @ 0), ("nort" @ 9), ("orth" @ 1), ("orth" @ 10), ("rth" @ 2), ("rthw" @ 11), and so on. For example, the compression device may sort the tags based on the windows of k symbols. The compression device may compare symbols from the storage locations in the memory device to identify the one or more copied symbols and the corresponding one or more literal symbols for the parallel sort and select, for each copy reference pointer, the storage location corresponding to the position identified by the respective copy reference pointer.

At step 406, the compression device may, for each tag in the sorted sequence, compare the tag with adjacent or neighbouring tags. For example, if there is a tag with a common prefix of at least four symbols that has an earlier source or other source, the system or device may create a copy token in the data stream. Otherwise, the system or device may create a literal token in the data stream. For example, in the data stream the symbols or characters of the tag ("nort" @ 9) may be replaced with a copy token (copy @ 0) to indicate that four literal characters should be copied from location 0 for location 9. The notation (copy @ 0) is an illustrative example and may also be expressed as "copy 4 symbols from 9 symbols ago", "copy delta 9", and so on. The symbols or characters of the tag ("orth" @ 10) may be replaced with the copy token (copy @ 1), "copy 4 symbols from 9 symbols ago", "copy delta 9", and so on. The process may transform the initial input data stream to generate an intermediate data stream of copy tokens and literal tokens, each being linked to their original location in the input data stream.

The process may compare each tag to a predetermined number (e.g. three forward and three backward but this can be modified and customized) of neighbouring or adjacent tags to identify redundant tags, for each redundant tag, the window of k symbols being equal to the window of k symbols of another tag. The redundant tags may be identified using a number of tokens smaller than the window. For example, k may be seven and redundant tags may be identified by six overlapping symbols. The number of common symbols used to identify redundant tags may be less than the number of symbols in the window. The process may involve, for each redundant tag, generating a copy token of the copy tokens for the history search output data stream, and selecting the storage location corresponding to the tag position of the other tag for the copy reference pointer for the copy token for the redundant tag. The redundant tags may be identified is a number of symbols are all equal another tag. The process updates each redundant tag by replacing the window of k symbols of the redundant tag with the copy reference pointer.

At step 408, the system or device may order the resulting tokens by their original location in the input data stream (e.g. as stored in the tags) to generate a history search output data stream (e.g. an intermediate output stream). This may be an intermediate data structure that may be provided as input to an encoder for further compression processing. The process may involve ordering the tags, including the redundant tags, by the tag positions to generate the output data stream of the literal tokens and the copy tokens, the copy tokens corresponding to the redundant tags at the tag positions in output data stream.

For example, the input sequence "North by Northwest" shown in FIG. 2 may be parallel processed by tagging and sorting to produce the (intermediate) history search output data stream:
Literal N
Literal o
Literal r
Literal t
Literal h
Literal SPACE
Literal b
Literal y
Literal SPACE
Copy 4 symbols from (delta) 9 symbols ago.
Copy 4 symbols from (delta) 9 symbols ago.
Literal r
Literal t
Literal h
Literal w
Literal e
Literal s
Literal t The process may involve connecting to a recipient device to output the history search output stream for compression of the input data stream.

The process may involve encoding literal tokens and copy tokens of the history search output data stream into a compressed output stream by eliminating a portion of the copy tokens and a portion of the literal tokens, the compressed output data stream being compressed relative to the input data stream. The process may coalesce copy tokens into larger copy tokens, coalesce individual literal tokens into larger literal tokens, and for copy tokens where length is n then the next n−1 tokens need may be removed. This may be implemented by an encoder as described herein.

Accordingly, after the history search process, the compression device may implement an encoding process to further compress the data resulting from the history search. For example, the final encoding may not include the second copy, nor the literals for "rth". The final encoding may also combine the two overlapping copies of length 4 to produce one of length 5. But this is not the purpose of this history search stage of the compression sequence. A separate encoding process may then encode the output of the history search into a stream that might look like the following: (Literal length=9) "North by" (Copy delta=−9 length=5)(Literal length=4) "west". Special control codes may be used to encode (Literal length=9) and (Copy delta=−9 length=5), and so on. The quotations would not be included and are used for clarity to define the string of literals. An example encoding processing is described herein in relation to FIG. 7. This is an illustrative example and other encoding processes may be used to encode the results of the parallel history search in various embodiments.

Figure 9:
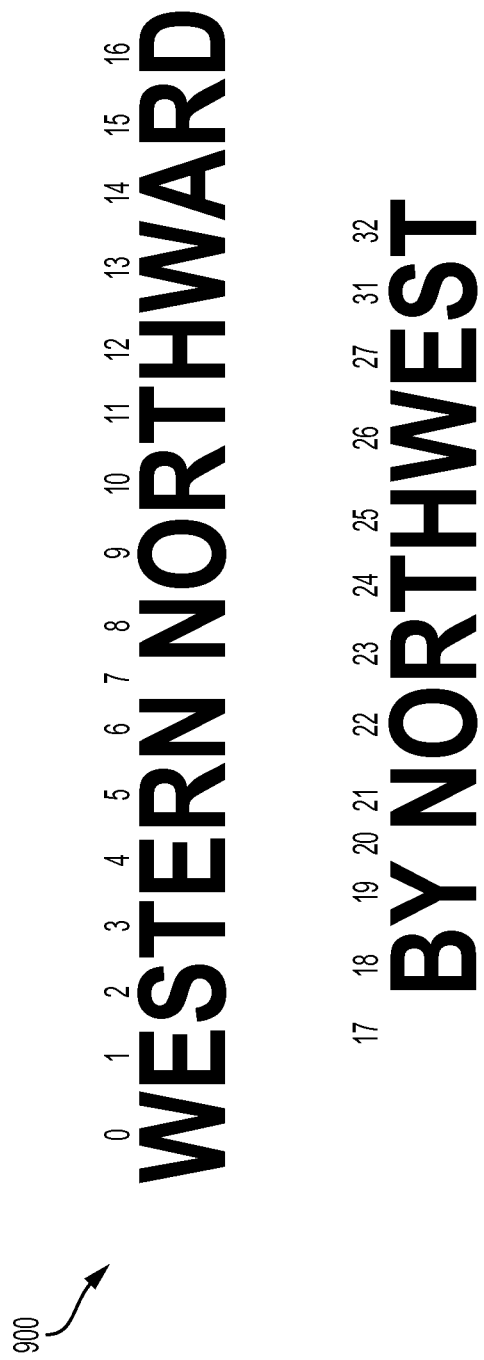
FIG. 9 is an alternate schematic view of illustrative example input for compression processing.

FIG. 9 illustrates another example input stream. Referring back to the search history process 400 of FIG. 4, at 402, the compression device creates tags for the input data. The tags may be generated in parallel. For this example, each component of the tag has at least 4 characters. Longer sequences may make the sort operation slower, and shorter sequences may create to many tags which may impact compression. The example tags may be (west @ 0) (este @ 1) (ster @ 2) and so on.

At 404, the compression device implements a parallel sort of the tags using prefix of characters or symbols (e.g. token) and the location. This will result in a sorted structure with all common prefixes being adjacent entries in the data structure.

At 406, the compression device compares adjacent and neighbouring entries and matched common strings of symbols in parallel. For example, the compression device may look three entries ahead and three entries behind for common strings. The compression device replaces common literal strings with copy references. In some example embodiments, the compression device uses a strict directed (e.g. only backward, only forward) reference to avoid circular pointers in the copy reference.

The compression device performs an encoding or tokenization for the history search and to replace literal tokens with copy tokens. At the start of the encoded sequence the compression device may still generate many literal tokens but as the memory size increase more copy tokens will be generated to reference literal tokens.

For the example input string shown in FIG. 9, the intermediate data stream may be a combination of literal and copy tokens: WESTERN_NORTHWARD_BY[copy, 8][copy, 9][copy, 10]TH[copy, 0]EST, where letter symbols indicate literal tokens.

The intermediate data stream output by the history search may also be represented as: (Lit 'W')(Lit 'E')(Lit 'S')(Lit 'T')(Lit 'E')(Lit 'R')(Lit 'N')(Lit ' ')(Lit 'N')(Lit 'O')(Lit 'R')(Lit 'T')(Lit 'H')(Lit 'W')(Lit 'A')(Lit 'R')(Lit 'D') (Lit ' ')(Lit 'B')(Lit 'Y')(Copy delta=−13, len=4)(Copy delta=−13, length=4)(Copy delta=−13, len=4)(Copy delta=−13, len=4)(Lit 'T')(Lit 'H')(Copy delta=−26, length=4)(Lit 'E')(Lit 'S')(Lit 'T'). The reference "Copy delta" may indicate the location of the characters or symbols to copy relative to the location of the copy token in the intermediate string. The reference "length" may indicate the number of characters to copy.

The next stage in the compression is encoding which may further reduce the intermediate data structure to combine copies and remove redundant literals.

The output of the encoder for the example WESTERN_NORTHWARD_BY_NORTHWEST may be: (Literal length=20)"WESTERN_NORTHWARD_BY" (Copy delta=−13, length=5)(Copy delta=−26, length=4). Another example output of the encoder may be: (Literal length=20) "WESTERN_NORTHWARD_BY" (Copy delta=−13, length=6)(Literal length=3)"EST". The first example may compress better.

In accordance with another aspect, embodiments described herein may provide hardware implemented memory-based history search for compression. To achieve high speeds in a compression algorithm, one of the steps to increase efficiency for compression speed is history search. The history data size may grow up to kilobytes, megabytes, or even higher. Searching the history data for matches may be a time-consuming task during the compression process. An example hardware platform that may be used in order to parallelize the history search may be an FPGA. Other example parallel processing devices may also be used such as a GPU or parallel CPU, and may be ideal for this process.

Example embodiments described herein may be based on the requirements of a fast and parallel history search for compression. Example embodiments described herein may use FPGAs as the compression device hardware platform. Example embodiments described herein may consider hardware constraints including: the number of available registers on the FPGA; route-ability; and power consumption.

Hardware Implementation

In some approaches, the serial nature of the input data and large histories can result in a lengthy history matching/search process. The speed of this process may, in some examples, be improved by parallelization of one or more aspects of the process.

Hardware implementations of the history matching process may be suitable for performing parallel tasks.

Figure 5:
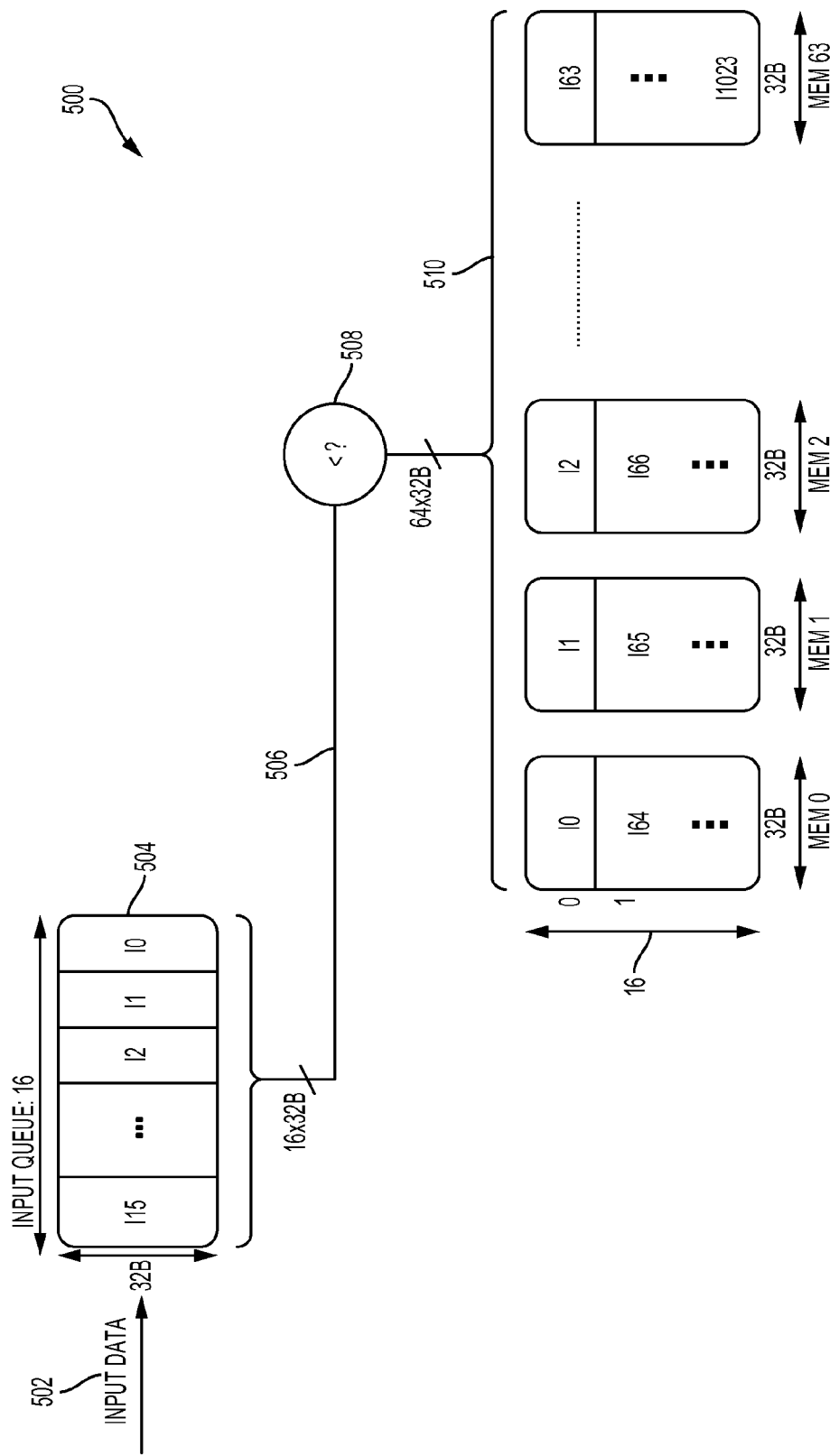
FIG. 5 is a schematic view of a comparator network for use with data compression according to some embodiments.

FIG. 5 illustrates aspects of an example circuit 500 for history matching. The circuit 500 may be implemented with any combination of discrete and/or integrated components. In some embodiments, the circuit 500 can be implemented on a field-programmable gate array (FPGA) or an application-specific integrated circuit (ASIC).

The circuit 500 can be configured to history match input data 502 as a sequence of words. In the example circuit 500 in FIG. 5, the words are 32 Bytes long; however, in other embodiments, the words can be portions of the data stream of any other length, for example, 1B, 2B, 4B, 8B, 16B, 64B, 128B, 256B, etc. In some examples, the word length can be based on hardware requirements or limitations (e.g. an FPGA data bus size limitation) or based on a history matching minimum tag size.

The circuit 500 can include a first memory 504 including a number of storage locations suitable for storing input data words. In some embodiments, the first memory can be made up of one or more storage elements. In other embodiments, the first memory can be a single larger memory element. For example, the first memory 504 in the example circuit 500 of FIG. 5 includes sixteen 32B storage locations. In some examples, these storage locations could be spread across a number of registers or separate memory devices. In another example, these storage locations can be part of a single memory device such as a RAM (random access memory) module.

The first memory 504 having N storage locations can be configured to store the N most recently introduced words from the sequence of input data. In some embodiments, the first memory 504 can be a shift memory or shift register. In some such embodiments, a newly introduced word can be stored in a first memory location (e.g. the memory location storing I15 in FIG. 5) while all other words in the first memory being shifted to the memory location to the right. With the introduction of a new word, the oldest word in the first memory 504 (i.e. the memory location stored I0 in FIG. 5) is overwritten or is otherwise flushed from the first memory. In other embodiments, the sequence of the shifting can be from left to right, or in any other first-in-first-out type order.

In another embodiment, the first memory 504 can be configured to store the N most recently introduced words by overwriting the oldest word in the first memory with a currently introduced word. For example, a selector such as a pointer, counter, linked list, or other element or process can provide an address or other storage location identifier which changes with the introduction of each word and cycles through each memory location. For example, the example circuit in FIG. 5 may include a 4-bit counter as a selector for the first memory.

In an illustrative example, a first word in the sequence can be stored at I15, a second word at I14, a third word at I13, etc., with the sixteen word being stored at I0. The seventeenth word would then be stored in I15 overwriting the first word in the sequence.

The first memory 504 can be an array of registers, circular buffers, etc. or any other data storage structure(s) which can allow a newly introduced word to be stored while allowing for all N storage locations to be read in the same clock cycle. For embodiments where the words in the first memory are shifted, the first memory 504 may be any data storage structure(s) which can allow all N storage locations to be read and written in the same clock cycle.

In some embodiments, the first memory 504 may be an array of dual-port or two-port memory such that each storage location of the first memory 504 can be both read and written to in the same clock cycle. In some examples, this can allow for the memory to be writing a newly introduced word while being read to provide data 506 for comparison by the comparators 508. In some instances, this may improve the effective pipelining of the process.

The circuit 500 includes an array of second memories 510 for storing historical input data. The example circuit 500 in FIG. 5 includes an array of sixty-four second memories each having 16 storage locations. In other examples, any number M of second memories may be used. In some embodiments, the number of second memories may be based on hardware requirements, availability or limitations (e.g. an FPGA maximum block RAM size) or based on a desired history matching size.

In some embodiments, the number of storage locations in each second memory corresponds to the number of storage locations in the first memory 504.

The array of second memories 510 defines a set of storage locations for storing a history of the input data 502. In some embodiments, the set of storage locations can be logically divided into rows with each row including one storage location from each of the second memories. For example, row 0 includes storage location I0 in Mem 0, storage location I1 in Mem 1, storage location I2 in Mem 2, . . . and storage location I63 in Mem 63.

In some embodiments, the second memories 510 can be configured to store the N×M most recently introduced words. For example, a selector such as a pointer, counter, linked list or other element or process can provide an address or other storage location identifier which changes with the introduction of each word and cycles through each memory location. For example, in FIG. 5, a 10-bit counter can be used as a memory selector where the lower 6 bits of the counter can identify in which of the 64 second memories an introduced word is to be written, and the upper 4 bits of the counter can identify the memory location within that second memory.

In some embodiments, the selector can cycle through memory locations in any sequence whereby M consecutively introduced words are each stored in a different second memory in the array.

In some embodiments, the second memories 510 may be a dual-port or two-port memories such that they can be both read and written to in the same clock cycle. In some examples, this can allow for the memory to be writing a newly introduced word while being read to provide data for comparison by the comparators 508. In some instances, this may improve the effective pipelining of the process.

In some embodiments, the circuit 500 can include a row selector for identifying a select row of memory locations in the array of second memories which is to be compared with the words in the first memory. For example, a selector such as a pointer, counter, linked list or other element or process can provide an address or other row identifier which changes with the introduction of each word and cycles through each row. For example, in FIG. 5, a 4-bit counter can identify which of the 16 rows is to be used in the current clock cycle and/or while the current word is being introduced and stored in the memories.

In embodiments, where the circuit 500 is implemented on an FPGA, the specifications of the FPGA may limit the options for the first and/or second memories. For example, not all the registers on an FPGA may be available as second memories to store history on the FPGA. For example, if the desired history size is 32 KB, configurations may specify that 32 KB=256 Kb of registers are required to store the history on the FPGA. This amount of resources may not exist or may not be available to the history matching device. Even if the required number of registers are available to store the history on an FPGA, routing may become an issue.

In accordance with embodiments described herein, circuits and devices may store the history using on "on-chip memories" or BRAMs (Block-RAMs) as second memories. In some examples, this may simplify or help organize routing and/or reduce the use or required number of registers.

The circuit 500 includes a plurality of comparators 508 for comparing a word from each storage location in the first memory 504 with the data stored in the select row of the second memories 510. In some embodiments, the comparators are configured to compare the word against a series of data windows of the history data in the select row of the second memories. The number of data windows can, in some embodiments, be based on the number of bits for encoding a symbol/character in the compression process. In some embodiments, each data window can represent a word-sized portion of the history data found at a different number of symbol-sized offsets. In other embodiments, data windows may be based on an input bus width or available resource(s) in the hardware.

In a basic example, a word in a first memory location of the first memory is one byte long and has a value of 0xFF. The second memory is an array of three memories, and the storage locations in the select row have the values 0x11, 0x22, 0x33. If a symbol is four bits, the circuit will have enough comparators to compare 0xFF with data windows of 0x112233 shifted in 4-bit increments. In other words, comparators would be configured to make at least five comparisons: 0xFF with 0x11, 0xFF with 0x12, 0xFF with 0x22, 0xFF with 0x23, and 0xFF with 0x33.

The circuit would also have comparators to compare data in the other memory locations of the first memory with the data from the select row of the second memories. For example, if the next memory location of the first memory contains the value 0xEE, some of the comparators would be configured to compare: 0xEF with 0x11, 0xEF with 0x12, 0xEF with 0x22, 0xEF with 0x23, and 0xEF with 0x33 (for the overlapping data window between the two first memory locations); and 0xEE with 0x11, 0xEE with 0x12, 0xEE with 0x22, 0xEE with 0x23, and 0xEE with 0x33.

The comparators would be configured to compare data windows from the data in all of the first memory locations against data windows with all the data in the select row of the second memories.

In some embodiments, the circuit may include storage elements for storing data from previous data in the first memory and/or data from a previous select row in order to capture any history matches which span multiple rows or multiple first memory words. In some embodiments, the storage elements may be the size of a symbol/character.

For example, building on the example above, if the previous select row ended with 0x56 (i.e. the history data includes . . . 0x56112233 . . . ), the circuit may have a storage element which stores the value 0x6. In addition to the above comparisons, the comparators would be configured to compare 0x61 with the data of the first memories (0xFF, 0xFE, 0xEE, etc.). In some examples, this handling of data window(s) overlapping with previous data rows could similarly be applied to the data window(s) for purged first memory data.

In some embodiments, the comparators are configured to concurrently perform all of the data comparisons for the data in the first memory against the data in a select row.

The comparators may be any comparator circuit or device for determining whether two words have the same value. In some examples, the comparators may be logic gates, FPGA logic blocks, lookup tables, or any other suitable comparator circuit.

In some embodiments, the circuit 500 may include one or more storage devices for storing the outputs of the comparators.

In some embodiments, the comparator outputs which represent history match results may be collated and/or provided to an encoder or other device or process to continue the compression of the input data.

The illustrative example of FIG. 5 provides a history matching network, comparing 16 input against 32 KB of history stored in memory, in 16 clock cycles.

As shown, assume blocks of n-byte input are streaming into the input queue to be compared against history. Also, assume that over time, the whole 32 KBytes of history is stored into 64 memories, each of which is 16 deep and 32 Bytes wide (64*16*32Bytes=32 KBytes). The history can be thought of as a sliding window that holds the past 32 KB of input data.

Assume for this illustrative example that each of the memories may be configured as dual-port. One port may be allocated for reading to compare the content of history with the input. In order to compare a block of 32 Byte input data with the whole history, 1024×32 Byte comparisons may be required. This means that in clock cycle 0, location 0 out of 15 may be read from all 64 memories for history compare and 64×32 Byte comparisons are done. As the input is shifted into the 16-deep input queue, it may be compared against the next 64 entries at location 1 of all the memories; then 64 entries at location 2 of all the memories and so on and so forth until the last comparison at location 15. Then that input data block may be compared against the whole 32 KB of history.

Figure 6:
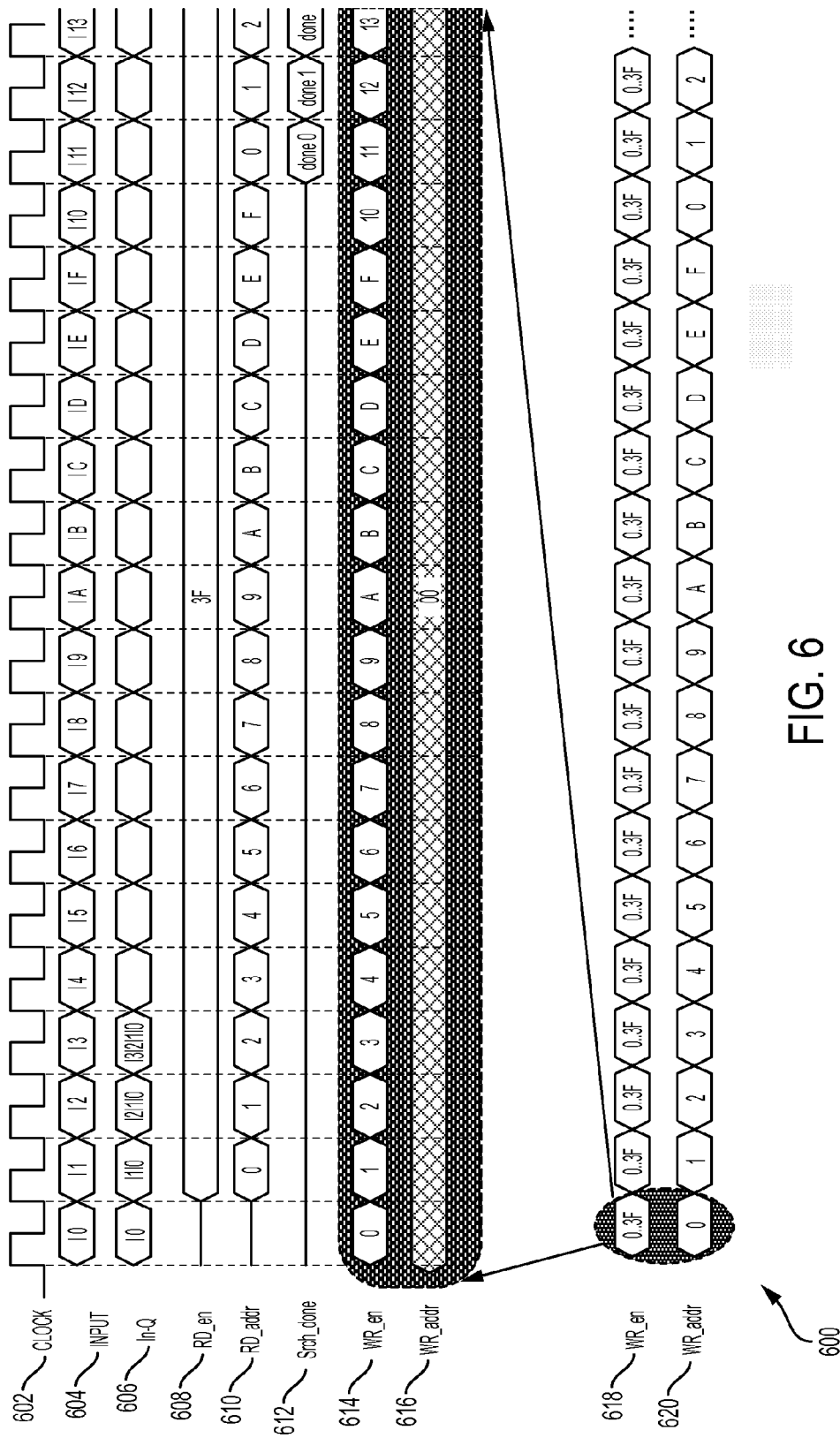
FIG. 6 is a schematic view of a timing diagram for use with data compression according to some embodiments.

Referring back to FIG. 5, in order to parallelize the history search for multiple blocks of input streaming in, the data read from the history may be compared against the whole input queue. For example, input data portion I0 may come in at Q=I0. Q15 may be compared with all-mems, loc0. Input data portion I1 may come in at Q=I1, I0. Q15, Q14 may be compared with all-mems, loc1, which may mean that I1 may not be compared against first row of all-mems. Hence, reading from memories may be done circularly to ensure each input block is compared against all mem rows. Then input data portion I2 comes in: Q=I2, I1, I0. Q15, Q14, Q13 may be compared with all-mems, loc2, and so on. Then input data portion I16 may come in at I16, I15, I14, I13, . . . , I1. Q15, Q14, . . . , Q0 may be compared with all-mems, loc0. Additional details on processing may be shown in FIG. 6 which illustrates an example timing diagram of history search according to some embodiments.

The other memory port may be allocated to write the new input block into the history. The new input may be written in location j out of 16 of only one memory. This location j may be calculated in a way that the new input may be written either at the next empty location in history if it is not yet 32 KB, or, may overwrite the oldest entry in the history. The write order may be found in the diagram shown in FIG. 6.

As an illustrative example, if the input is streaming into a 16-deep input queue, then each input needs 16 clock cycles until it is compared against the whole history. This may be performed in a pipeline format. The comparisons may overlap, which means it may only need 16 clock cycles to initialize the pipeline and after that, by reading the history in a circular way, in each clock cycle the result of comparisons for future inputs may be ready.

This technique is explained herein using an illustrative example. This example may be generalized for any number of input size and history size with consideration to the resource limitations of the FPGA or other hardware used for the implementation.

Embodiments described herein may involve parallel hardware for GPU containing a hash table and forward copies. Hardware limitations may be considered when selecting the particular hardware for the implementation. For example, it may be difficult to manage communication and synchronization between compute units on GPU to create the output.

Embodiments described herein may involve a code implementation that is portable across different hardware platforms, and across different hardware vendors (e.g. FPGA vendors). Embodiments described herein may provide heterogeneous implementation involving FPGA, CPU, and GPU/accelerated processing unit (APU) implementations.

In another aspect, embodiments described herein may provide an APU implementation with a heterogeneous approach to combining parallelism of GPU and CPU. Embodiments may involve parallel processing for an APU comprising hash table creation (GPU), parallel literal and copy creation (GPU), and merging of output encoding (CPU). Hardware limitations may be considered when selecting the particular hardware implementation. For example, there may not be enough compute units on a GPU to implement the processing.

In a further aspect, embodiments described herein may provide another APU implementation with a heterogeneous approach to combining parallelism of GPU and CPU. Embodiments may involve parallel processing for an APU comprising global hash table creation (GPU), parallel literal and copy creation (GPU), and merging of output encoding (CPU). Hardware limitations may be considered when selecting the particular hardware implementation. For example, a global memory may involve execution of the kernel.

Encoder

In another aspect, embodiments described herein may provide a systolic dictionary-based compression encoder, e.g. a hardware device configured to implement encoding to transform a sequence of tokens into a compressed output stream. An example application may be on-the-fly network compression. After implementing a history search, the compression device may encode the data stream for further compression. This may involve combining copies of copy tokens and removing further redundant literal tokens. The pre-processed intermediate data stream that provides input for the encoder may result from the parallel history search described herein, or another search process. Other example history searches include traditional "snappy" processes using hash tables, the FPGA hardware implementation described herein, and so on. As an illustrative example for different history search processes consider the input data stream "BRANDISH_OATBRAN_BRANDY". At the position of "BRANDY", a history search could find "BRAND" from "BRANDISH" or "BRAN" from "OATBRAN". Either may be correct output from a history search. Different searches may prioritize one over the other. This output of the history search is provided to an encoder for further processing.

An encoder may generally look for adjacent copy tokens where the first length of symbols or delta for the copy reference (e.g. copy four symbols from 9 symbols ago) is greater than or equal to the next delta. The encoder may select the first copy token and then look at adjacent copy tokens. The encoder may start incrementally deleting copy tokens and expanding the number of characters copied in the first copy token.

As shown in FIG. 2, the intermediate data stream may be a combination of literal and copy tokens: NORTH_BY_[copy, 0][copy, 1]RTHWEST. The resulting output from the encoder is shown in FIG. 2 which combines the two copy tokens [copy, 0] for "nort" and [copy, 1] for "orth" each with four symbols into one copy token of five symbols for "north".

As shown in FIG. 9, the intermediate data stream may be a combination of literal and copy tokens: WESTERN_NORTHWARD_BY[copy, 8][copy, 9][copy, 10]TH[copy, 0]EST. A copy token reference may initially reference four characters but after encoding may reference six characters and remove two copy tokens. In this example, the encoder may combine the initially separate copy tokens "nort" "orth" "rthw" into one copy token "northw" with a larger set of symbols or characters.

As shown by these examples, this encoding process expands the number of symbols in a copy token while removing adjacent copy tokens to provide further compression.

For this example, a task of the encoder may include merging adjacent literals into larger literals. The history search may indicate that there is (Lit 'N')(Lit 'O')(Lit 'R')(Lit 'T')(Lit 'H') and turn it into (Lit length=5) "North". Another task of the encoder may include merging adjacent copies to overlapping sources. For example, (Copy delta=−4 len=4)(Copy delta=−4 len=4) can be changed into (Copy delta=−4 len=5) and the subsequent copy removed from the stream. A further task of the encoder may include removing literals that are "covered" by copies. The output from the history stream for the stream "AAAAAA" may be (Lit 'A')(Copy delta=−1 length=4)(Copy delta=−1 length=4)(Lit 'A')(Lit 'A')(Lit 'A') and the encoder may transform it into (Lit length=1)'A'(Copy delta=−1 length=5). Notice that the tailing literals have been "covered" by the copy.

The encoder may implement a greedy algorithm process that may attempt to get the longest copy reference length when deleting adjacent copy references. This may not always provide the optimal compression but this may result in increased compression speed. For example, some encoding operations may select optimal combinations of repeated words. Referring to the example in FIG. 9, instead of making longer copy token "northw" another process may look to remove as many repetitions as possible and identify "north" and "west", for example.

The encoding processing may also decrease the window size to create additional copy tokens to remove redundant literals. For, example the literal token "est" may be replaced with a copy token by reducing window size.

The encoder may be implemented using parallel processing for the scan operation (which may also referred to as a prefix sum). The scan is parallel and used for compression processes according to some embodiments described herein. For example, the encoder may implement the scan process on intermediate data produced by the parallel history search described herein, or by other history search techniques in other embodiments.

As noted, compression may take a sequence of symbols as input, and attempt to produce a shorter sequence as output. Dictionary based compression schemes may find repeated substrings in the input and encode subsequent occurrences as copy reference pointers to earlier occurrences, or later occurrences, for example.

Embodiments described herein may provide a mechanism to transform a sequence of symbols into a sequence of tokens. Each symbol may be either a literal token (e.g. not a reference to a previous/later position in the input stream), or a copy token from the history specifying the position in the stream and the number of characters copied. Copy tokens may have copy different numbers of characters, as the encoder will combine copy tokens from the history search output to provide compressed output data.

Embodiments described herein may use a data-parallel encoding mechanism. The input data stream may be encoded sequentially which may make the encoding process the bottleneck. In some examples where the history search is also parallel then a sequential encoding processing may lose the processing benefits of parallelizing the history search. Accordingly, embodiments described herein may involve a mechanism for performing the encoding process in parallel.

Embodiments described herein may provide a circuit for an encoding device 806 (FIG. 8) to encode an input data stream to generate a compressed output stream.

The circuit may have an input unit to receive an incoming input data stream of a sequence of tokens. Each token defines a position in the input data stream, a length and a type. The type may be a literal token or a copy token. Each literal token defines a literal symbol and each copy token has an offset to the position of another token in the sequence of tokens in the input data stream. A memory device stores the sequence of tokens of the input data stream at storage locations.

A parallel processor encodes the tokens using a parallel scan of the input data stream in the memory device to simultaneously process each token of the input data stream while referencing other tokens that precede the position of the respective token in the sequence of tokens of the input data stream. The parallel processor generates the compressed output stream by eliminating a portion of the tokens of the input data stream based on the results of the parallel scan.

A plurality of comparators to compare the sequence of tokens from the storage locations in the memory for the parallel scan. Examples of comparators are described herein in relation to the FPGA memory search. A memory selector to select, for each copy token, the storage location corresponding to the position of the offset. Examples of comparators and selectors are described herein in relation to the FPGA memory search. The comparators and selectors may be used to implement operations of the parallel scan.

An output unit configured to connect to a recipient device to output the compressed output stream. A compression device may receive the output of the circuit of claim for provision to a network interface for transmitting the compressed output stream. A compression system may receive the output of the circuit for provision to a storage controller for storing the compressed output stream on a physical non-transitory computer readable medium. The circuit may be implemented on graphic processing unit, a parallel central processing unit or a field programmable gate array. The parallel processor may implement a parallel history search to generate the tokens of the input data stream. The parallel processor may implement a parallel history search using a parallel sort to generate the tokens of the input data stream. The parallel processor may implement sequential history search to generate the tokens of the input data stream. Accordingly the parallel processor for encoding can work with different types of history searches to receive the input tokens.

The encoding process may be implemented in the case where there are as many threads as input tokens. i.e., each thread will be responsible for emitting bytes generated by its own token. This may be challenging because the position each thread would need to write is dependent on the aggregate of the number of bytes written by all threads that precede it in the input stream. Some communication may be required between threads, but may be kept to a minimum to efficiently use communication resources.

As an illustrative example overview, systems, methods and devices in accordance with embodiments described herein may use a scan technique for parallel processing.

The parallel scan technique may be a generalization of a prefix sum, for example. The technique may involve using an associative operator $\oplus$, and a sequence e $x_i$ with i$\in\{1, 2, \ldots, n\}$ and calculates:

$$y_j = \bigoplus_{i=1}^{n} x_i$$

For example, the sequence 1; 2; 3; 4; 5 with the operator being addition may generate: 1; 3; 6; 10; 15. That is, the jth term is a sum (using the provided operator) of the first j terms of the input sequence.

A variation, called a right scan, or forward scan, instead sums from the end of the sequence. To distinguish, the standard technique may be referred to as a left scan or backward scan. This technique may be performed in parallel. For a sequence of length n with m independent processors, the technique may be calculated in $$\log_2(n)\frac{n}{m}$$

stages.

The parallel scan technique may work as follows: the input data may be defined in $\log_2(n)$ stages. At each stage j, the technique may compute yj;i for i in 0; 1, 2, . . . , n−1. The following definition may be used $y_0$, i=$x_i$ for i$\in\{1, 2, \ldots, n\}$. For stage k E $\{1, 2, \ldots, [\log_2(n)]\}$, the following definition may also be used $\Delta=2^{k-1}$. For a forward pass, the following definition may be used $Y_{k,i}=y_{k-1,i-\Delta}\oplus y_{k-1,i}$. For a backward pass, the following definition may be used $y_{k,i}=y_{k-1,i+\Delta}\oplus y_{k-1,i}$.

Figure 7:
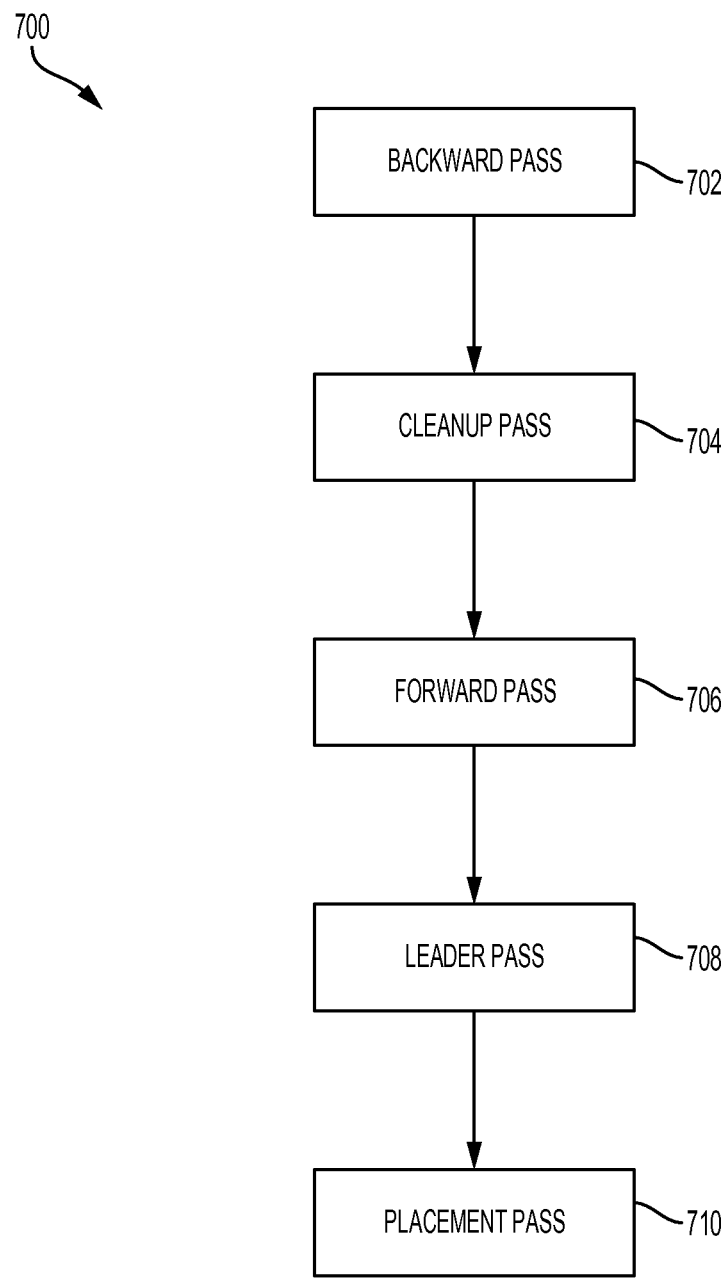
FIG. 7 is an alternate flowchart view of an example method for data compression according to some embodiments.

In another aspect, embodiments described herein provide a process for compression encoding using a parallel process. FIG. 7 illustrates an example method 700 for data compression according to some embodiments. The method 700 may be implemented by a circuit, encoder, a compression device, compression system, and so on.

In some example embodiments, the encoding process may encode the output of the parallel history search as described in relation to FIG. 4. As noted, the separate encoding process of FIG. 7 may then encode the output of the history search for the example input stream of FIG. 2 to generate the following output stream: (Literal length=9) "North by" (Copy delta=−9 length=5)(Literal length=4) "west". There may be special control codes may be used to encode (Literal length=9) and (Copy delta=−9 length=5), and so on. The quotations would not be included and used for clarity.

Each token may have a length, len($\tau$), and a type, type($\tau$) which is either a literal value or a copy reference pointer. Copy tokens may also define an offset, offset($\tau$) which may be the number of characters back the copy is from. Literal tokens may define a symbol sym($\tau$). Accordingly, the input data stream may be a sequence of tokens, where each token defines a position in the input data stream, a length and a type, the type being a literal token or a copy token. Each literal token may define a literal symbol, and each copy token may have an offset to the position of another token in the sequence of tokens in the input data stream.

The process involves encoding the tokens using a parallel scan of the input data stream in a memory device to simultaneously process each token of the input data stream while referencing other tokens that precede the position of the respective token in the sequence of tokens of the input data stream. The process involves generating a compressed output stream by eliminating a portion of the tokens of the input data stream based on the results of the parallel scan. The output of the parallel scan may be updated tokens (e.g. updated copy tokens and literal tokens) along with a data structure identifying leader tokens, non-leader tokens, size data for the tokens, and position data for the tokens to instruct generation of the compressed output stream. The generation of the compressed output stream involves writing tokens to the positions, where the leader tokens, non-leader tokens and size data indicates which tokens are written out. For example, all leaders tokens may be written out but size zero copy tokens may not be written out. The process involves making available the encoded compressed output data as non-transitory computer readable medium or shared memory or transmission.

The process involves encoding the tokens using the parallel scan with a backward pass, a cleanup pass, a forward pass to simultaneously process the tokens of the input data stream to update the input data stream for generating the compressed output stream.

At step 702, the compression device may implement a backward pass.

In the first pass, both literals and copies may be present. Literal tokens may have length 1, copy tokens may have larger lengths. The examples herein provide an intermediate data stream with copy tokens initially of four characters. For this operation, the candidate token may be defined as y and the pivot be $\pi$. The distance between the two tokens is delta $\Delta$. When the condition is not met, the output may be identical to the pivot.

| type($\gamma$) | type ($\pi$) | condition | new token |
| --- | --- | --- | --- |
| COPY | — | len($\gamma$) > $\Delta$ | COPY(offset($\gamma$), len($\gamma$) − $\Delta$) |

At step 704, the compression device may implement a cleanup pass. For example, the system or device may implement two passes of a backward scan technique with the following:

| type(γ) | type(π) | condition | new token |
|---|---|---|---|
| COPY | COPY | offset(γ) ≠ offset(π) <br> Δ − len(γ) + len(π) < 4 | LIT |

At step 706, the compression device may implement a forward pass. In the third pass, any token covered by a copy may also be a copy. The leader of a sequence of copies with the same offset may have a length of at least 4. The purpose of this pass may be to polymerize or coalesce overlapping copies that have the same offset, as well as coalescing back-to-back literals to generate a longer sequence of literals. This may be a forward scan since the technique may propagate information from later entries in the stream to earlier entries.

The operator may be:

| type(π) | type(candidate) | condition | new token |
|---|---|---|---|
| LIT | LIT | len(π) ≥ Δ | LIT(sym(π), Δ + len(γ)) |
| COPY | COPY | offset(γ) = offset(π) <br> len(π) ≥ Δ | COPY(offset(π), <br> max(len(π), Δ + len(γ))) |

The process may involve using a leader pass and a placement pass to identify non-leader tokens, leader tokens, sizes for the tokens, and positions for the tokens in the compressed output stream to eliminate the portion of the tokens of the input data stream when generating the compressed output stream.

At step 708, the compression device may implement a leader pass. The initial token may be a leader. A literal immediately followed or preceded by a copy may be a leader. A copy followed or preceded by a literal may be a leader. A copy followed or preceded by a copy with a different offset may be a leader. No other tokens may be leaders, for this illustrative example. This may be implemented by looking at a token and its predecessor independently of all other leader checks.

At step 710, the device or system may implement a placement pass. As an illustrative example, assume there is a function a mapping each token to an encoding size in constant time. In some examples, all non-leader copies may be fixed with a size of 0 and all non-leader literals to have a size of 1, then a prefix sum of the sizes will provide the endpoint of each token after it is encoded. Subtracting the size from this position yields the start location. Each token can be encoded independently. The prefix sum may be a backward pass.

The final pass may clean up conflicting copies for leader selection. The forward pass may coalesce copies into larger copies and literals into literal chains. The cleanup pass may remove certain short copies that are shorter than 4 symbols long and may result in being encoded in more bytes than a literal would occupy. The placement pass may be the encoder. Each pass may be data parallel and may lend itself well to parallel architecture.

Figure 10:
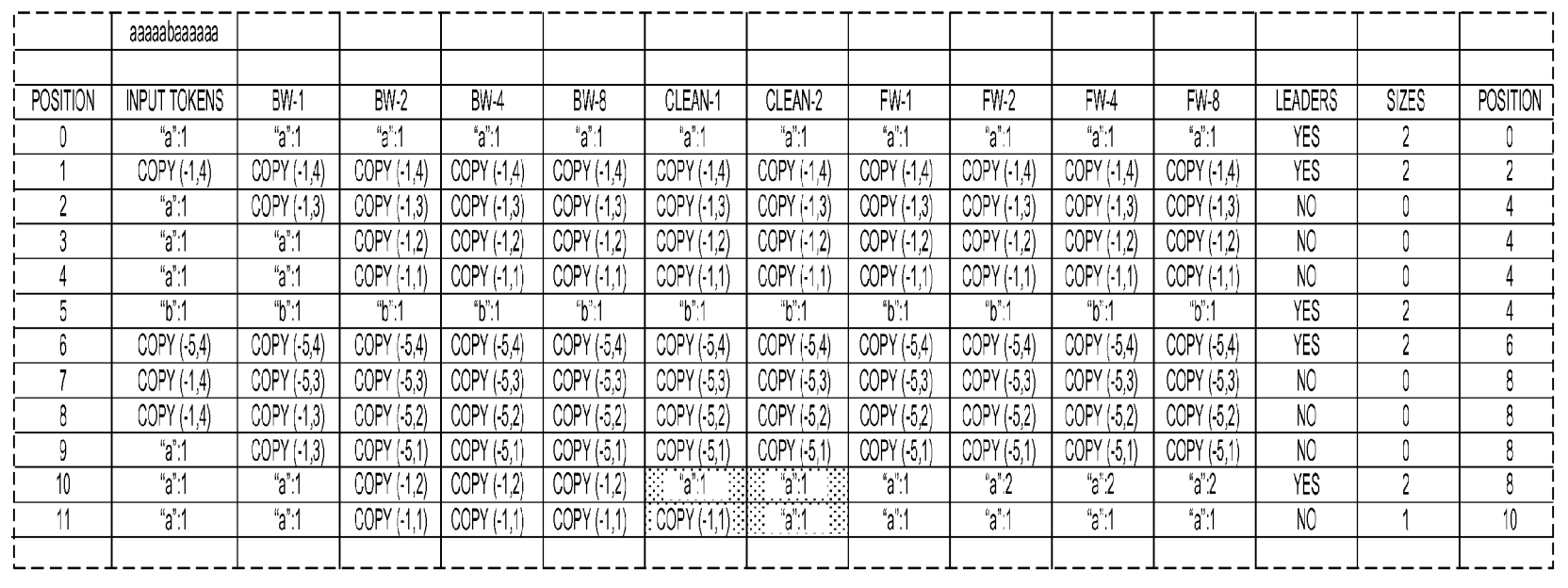

FIGS. 10 and 11 shown an example of the encoding process of FIG. 7 at different stages. FIG. 10 relates to the input data stream 'aaaaabaaaaaa'. FIG. 11 relates to the input data stream 'North by Northwest'. The input data streams are shown as tokens, including literal tokens and copy tokens. The literal tokens have a literal symbol and length shown by the format 'literal symbol':length. The copy tokens have a copy reference pointer with an offset value and a length of symbols to copy as shown by the format Copy (offset,length). The different columns show example results of the scan passes or stages.

The parallel processor uses the parallel scan with a backward pass, a cleanup pass, a forward pass to simultaneously process the tokens of the input data stream to update the input data stream for generating the compressed output stream. BW refers to backward passes, CLEAN refers to cleanup passes, and FW refers to forward passes. Each pass is implemented as a parallel scan with different scan parameters. The passes update the tokens of the input data stream.

The column entitled "BW-1" refers to a backward pass looking at one position over, "BW-2" refers to a backward pass looking at two positions over, and so on. The table highlights edge cases to highlight operations of the stages or passes. In the first example shown in FIG. 10, the highlighting shows the purpose of the cleanup pass. There are extra copy tokens at the end of the backward pass that would result in copies that are shorter than length four.

In the forward pass for the "north by northwest" example input data stream of FIG. 11 for literals the encoder uses a length to represent how many literals "follow" the current literal. The encoder uses the predefined length in order to know the size as well as what to put into the header. The token for N:9 may highlight an example where you need all log(N) stages of the forward pass to get the final encoding. The copy tokens are interesting in "north by northwest" example input data stream of FIG. 11 because the encoding process takes a few stages to stabilize, but the encoder does stabilize in the end.

The parallel processor uses a leader pass and a placement pass to eliminate the portion of the tokens of the input data stream when generating the compressed output stream. The column "Leaders" shows example results of the leader pass. The column "sizes" and "position" shown example results of the placement pass, which generates the size and position data.

The parallel processor updates the incoming input data stream using a backward pass (referenced as BW) to replace literal tokens with additional copy tokens, the replaced literal tokens being tailing ends of leader copy tokens. The additional copy tokens are eliminated from the compressed output stream and the replaced literal tokens are covered by the leader copy tokens.

The parallel processor updates the incoming input data stream using a cleanup pass (referenced as CLEAN) to replace copy tokens having a length of that is less than four with literal tokens. The parallel processor updates the incoming input data stream using a forward pass to coalesce consecutive overlapping copy tokens that have the same offset and contiguous literal symbols.

The parallel processor uses a leader pass to flag each token as being either a non-leader token or a leader token, the leader token being at least one of an initial token in the input data stream, a literal token followed or preceded by a copy token in the input data stream, a copy token followed or preceded by a literal token in the input data stream, and a copy token followed or preceded by a copy token with a different offset in the input data stream.

The parallel processor uses a placement pass to generate sizes for the tokens by fixing all non-leader tokens to have size zero and all leader tokens to have a size of one and determine, and positions for the tokens in the compressed output stream, each position defined by an endpoint and a start point for the token, the endpoint being a prefix sum of the sizes of all preceding tokens, the start point being a difference between the position and the prefix sum.

The parallel processor generates the compressed output data stream using results of the placement pass by writing out all tokens having a non-zero size using the sizes for the tokens to the positions for the tokens in the compressed output data stream. The results for the leader tokens (and non-leader tokens), the sizes and positions are used to generate or write the tokens for the compressed output data stream. The leader tokens and non-leader tokens may be used to generate the size data. All tokens are size zero are not written out to the compressed output data stream, which results in compression of the initial input data stream of tokens. The placement indicates the position of where a token should be written out in the compressed output data stream.

The parallel processor eliminates the portion of the tokens of the input data stream by coalescing copy tokens into larger copy tokens, coalescing individual literal tokens into larger literal token, and, for copy tokens where length is n, eliminating the next n−1 tokens in the input data stream.

The processor eliminates the portion of the copy tokens by increasing a number of symbols to be copied by a copy token adjacent to the eliminated portion of the copy tokens.

The encoder eliminates the portion of the copy tokens by replacing each copy token having a length less than a predefined threshold with a literal token.

Accordingly, embodiments described herein may provide systems, devices and methods for parallelizing a sequential process. Intuitively, the position of each encoding may depend on the aggregate encoding of all previous tokens. Embodiments described herein may provide systems, devices and methods for encoding tokens in the input stream in parallel.

The passes may be referenced as stages of the parallel scan. The scan (forward, backward, cleanup) takes tokens as input and outputs a group of tokens with different values. The leader pass identifies which tokens need a header in the final output. A header of a token may indicate a leader or non-leader (by comparing each token to previous token). The placement pass determines what tokens may be eliminated. For example, leader tokens provide information to size the tokens, and the prefix sum indicates position information for writing tokens at the locations or positions output by the prefix sum. The sizing indicates that some tokens take up zero bytes and these would be eliminated from the compressed output data stream. The leader pass and placement pass to eliminate a portion of the copy tokens of the sequence tokens of the input data stream, the encoding of, the compressed output data stream being compressed relative to the input data stream. The parallel scan uses different passes by repeated calls using slightly different parameters to generate the data used to write the compressed output data stream.

The encoder coalesces the portion of the copy tokens by increasing a number of symbols to be copied by a copy token adjacent to the eliminated portion of the copy tokens. The encoder coalesces consecutive overlapping copies into longer copies.

Figure 8:
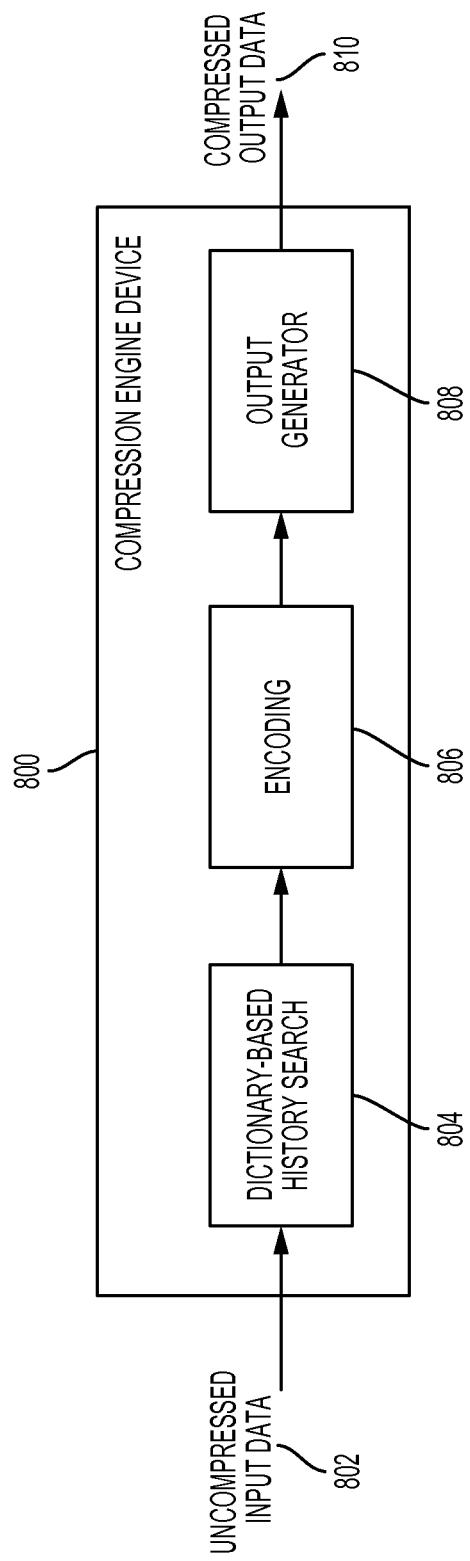
FIG. 8 is alternate schematic view of an example of a system for data compression according to some embodiments.

In another aspect, embodiments described herein may provide a compression engine device implementing data transformation techniques described herein. FIG. 8 shows an illustrative example compression engine device 800 (referred to generally as compression device) transforming uncompressed input data 802 into compressed output data 810. The example compression engine device may include a search processor 804 (e.g. implementing dictionary-based history search), an encoder 806 and an output generator 808.

The compression engine device 800 may be implemented using an integrated hardware device in some examples, or by distributed devices with direct or network connections.

The compression engine device 800 may implement parallel data processing using vector machines, as an illustrative example. At stage 1, the compression device 800 may use the processor 804 for a history scan based on sorting and merging using parallel data processing techniques. At stage 2, the compression device 800 may use the encoder 806. As an example, the compression engine device may use one logical processor for each byte of input. For this illustrative example, the compression device 800 may perform O(log n) passes where n is the size of the input. Each processor may use a constant size input per pass. The systolic communication and synchronization may be an efficient use of the hardware resources.

Embodiments described herein may use a parallel data processing technique as described herein. The encoding may translate efficiently to FPGA, for example. The input may be partitioned into chunks for different granularity streaming. The finer-grained streaming may impact the compression ratio. The history scan implementation may require hardware considerations. Sorting may be implemented using CPU/GPU architectures. FPGA architectures and line rat may require a large number of multiplexers and priority encoders. This may be resource intensive.

Modified embodiments may use bloom filters, linear scan, and so on. Modified embodiments may consider history size as a parameter that may be increased with bigger FPGAs. For some examples, the history size may be limited depending on the size of the FPGA. Other parameters may include input chunk size, and so on. Embodiments described herein may include propagation of copies or literals across windows to remove limitation of fine-grained streaming. Embodiments described herein may provide an efficient hardware architecture with no or few pipeline bubbles. Embodiments described herein may account for data streaming. Embodiments described herein may provide an interface for the hardware implementation. Embodiments described herein may include reconfigurable components. Embodiments described herein may implement in-path compression for solid state drives, hard disk drives, memory, network, and so on. Embodiments described herein may implement bit stream compression to speed up FPGA partial reconfiguration. Embodiments described herein may implement high speed decompression.

Embodiments may provide a technical solution embodied in the form of a software product. The software product may be stored in a non-volatile or non-transitory storage medium, which can be a compact disk read-only memory (CD-ROM), USB flash disk, or a removable hard disk. The software product may include a number of instructions designed to enable a computer device (personal computer, server, or network device) to execute the methods provided in the embodiments.

Program code is applied to input data to perform the functions described herein and to generate output information. The output information is applied to one or more output devices. In some embodiments, the communication interface may be a network communication interface. In embodiments in which elements of the invention are combined, the communication interface may be a software communication interface, such as those for inter-process communication. In still other embodiments, there may be a combination of communication interfaces implemented as hardware, software, and combination thereof.

Each computer program may be stored on a storage media or a device (e.g., ROM, magnetic disk, optical disc), readable by a general or special purpose programmable computer, for configuring and operating the computer when the storage media or device is read by the computer to perform the procedures described herein. Embodiments of the system may also be considered to be implemented as a non-transitory computer-readable storage medium, configured with a computer program, where the storage medium so configured causes a computer to operate in a specific and predefined manner to perform the functions described herein.

Furthermore, the systems and methods of the described embodiments are capable of being distributed in a computer program product including a physical, non-transitory computer readable medium that bears computer usable instructions for one or more processors. The medium may be provided in various forms, including one or more diskettes, compact disks, tapes, chips, magnetic and electronic storage media, volatile memory, non-volatile memory and the like. Non-transitory computer-readable media may include all computer-readable media, with the exception being a transitory, propagating signal. The term non-transitory is not intended to exclude computer readable media such as primary memory, volatile memory, RAM and so on, where the data stored thereon may only be temporarily stored. The computer useable instructions may also be in various forms, including compiled and non-compiled code.

Numerous references will be made regarding servers, services, interfaces, portals, platforms, or other systems formed from hardware devices. It should be appreciated that the use of such terms is deemed to represent one or more devices having at least one processor configured to execute software instructions stored on a computer readable tangible, non-transitory medium. One should further appreciate the disclosed computer-based algorithms, processes, methods, or other types of instruction sets can be embodied as a computer program product comprising a non-transitory, tangible computer readable media storing the instructions that cause a processor to execute the disclosed steps.

Various example embodiments are described herein. Although each embodiment represents a single combination of inventive elements, all possible combinations of the disclosed elements are considered to the inventive subject matter. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

The embodiments described herein are implemented by physical computer hardware embodiments. The embodiments described herein provide useful physical machines and particularly configured computer hardware arrangements of computing devices, servers, electronic gaming terminals, processors, memory, networks, for example. The embodiments described herein, for example, are directed to computer apparatuses, and methods implemented by computers through the processing and transformation of electronic data signals.

The embodiments described herein may involve computing devices, servers, receivers, transmitters, processors, memory, display, networks particularly configured to implement various acts. The embodiments described herein are directed to electronic machines adapted for processing and transforming electromagnetic signals which represent various types of information. The embodiments described herein pervasively and integrally relate to machines, and their uses; and the embodiments described herein have no meaning or practical applicability outside their use with computer hardware, machines, a various hardware components.

Although the present invention and its advantages have been described in detail, it should be understood that various changes, substitutions and alterations can be made herein without departing from the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for history matching a data stream being sequentially introduced to the circuit, the circuit comprising:
   a first memory including N storage locations, the first memory configured to store a currently introduced sequence of symbols such that the N most recently introduced words are stored in the first memory;
   an array of M second memories, each second memory including N storage locations, the array defining a set of storage locations logically divided into N rows of M storage locations, each row including one storage location from each of the M second memories, the array of M second memories configured to store the currently introduced word at a select storage location of the set of storage locations;
   a plurality of comparators configured for comparing data from all of the storage locations in the first memory with data stored in a select row of the set of storage locations, where outputs of the comparators provide history matching data;
   a memory selector for identifying the select storage location, the memory selector configured to identify a next storage location in a storage location sequence with the introduction of each word, where the storage location sequence cycles through the set of storage locations such that M consecutively introduced words are each stored in a different second memory in the array; and
   a row selector for identifying the select row, the row selector configured to identify a next select row with the introduction of each word, the select row cycling through each of the N rows for every N introduced words.

2. The circuit of claim 1 wherein the plurality of comparators are configured to compare overlapping data windows of the data in the first memory and the data in the select row.

3. The circuit of claim 1 wherein each of the second memories are dual port memories or two port memories.

4. The circuit of claim 1 wherein the circuit is implemented on a field-programmable gate array (FPGA) or an application specific integrated circuit (ASIC).

5. The circuit of claim 4 wherein the second memories are block random access memories.

6. The circuit of claim 1 comprising a storage device for storing the outputs of the comparators.

7. The circuit of claim 1 wherein the first memory is a shift register or a circular buffer.

8. The circuit of claim 1 wherein the circuit is a synchronous circuit configured to introduce a new word every clock cycle.

9. The circuit of claim 8 wherein an introduced word is compared against an N×M word history after N clock cycles.

10. The circuit of claim 2 wherein the data windows are based on an input bus width or circuit resource availability.

11. A method for history matching a data stream, the method comprising:
sequentially introducing each word in the data stream, where introducing a current word in the input sequence includes:
storing the current word in a storage location of a first memory having N storage locations such that the N most recently introduced words are stored in the first memory;
storing the current word in an array of M second memories, each second memory including N word storage locations, the array defining a set of storage locations logically divided into N rows of M storage locations, each row including one storage location from each of the M second memories, wherein the current word is stored according to a storage location sequence which cycles through the set of storage locations such that M consecutively introduced words are each stored in a different second memory in the array;
concurrently comparing data stored in the N storage locations of the first memory with data stored in a select row of the set of storage locations; and
storing outputs of the comparisons as history match results;
wherein the select row changes with the introduction of each word, the select row cycling through each of the N rows for every N introduced words.

12. The method of claim 11 wherein comparing the data stored in the N storage locations of the first memory with the data stored in the select row comprises comparing overlapping data windows of the data in the N storage locations of the first memory and the data stored in the select row.

13. The method of claim 11 wherein each of the second memories are dual port memories or two port memories.

14. The method of claim 11 wherein the method is performed on a field-programmable gate array (FPGA) or an application specific integrated circuit (ASIC).

15. The method of claim 14 wherein the second memories are block random access memories.

16. The method of claim 11 wherein storing the outputs of the comparisons comprises collating the history match results.

17. The method of claim 11 comprising providing the history match results to an encoder.

18. The method of claim 11 wherein an introduced word is compared against an N×M word history after N clock cycles.

19. The method of claim 12 wherein the data windows are based on an input bus width or circuit resource availability.

20. A device for history matching a data stream, each word of the data stream being sequentially introduced, the device comprising:
a first memory including N storage locations, the first memory configured to store a currently introduced word such that the N most recently introduced words are stored in the first memory;
an array of M second memories, each second memory including N storage locations, the array defining a set of storage locations logically divided into N rows of M storage locations, each row including one storage location from each of the M second memories, the array of M second memories configured to store the currently introduced word at a select storage location of the set of storage locations;
a plurality of comparators configured for comparing data from all of the storage locations in the first memory with data stored in a select row of the set of storage locations, where outputs of the comparators provide history matching data;
a memory selector for identifying the select storage location, the memory selector configured to identify a next storage location in a storage location sequence with the introduction of each word, where the storage location sequence cycles through the set of storage locations such that M consecutively introduced words are each stored in a different second memory in the array; and
a row selector for identifying the select row, the row selector configured to identify a next select row with the introduction of each word, the select row cycling through each of the N rows for every N introduced words.

* * * * *